US008829355B2

(12) United States Patent
Kariya et al.

(10) Patent No.: US 8,829,355 B2
(45) Date of Patent: Sep. 9, 2014

(54) MULTILAYER PRINTED WIRING BOARD

(75) Inventors: Takashi Kariya, Ogaki (JP); Kazuhiro Yoshikawa, Ogaki (JP); Daiki Komatsu, Ogaki (JP); Ramesh Bhandari, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 540 days.

(21) Appl. No.: 12/609,447

(22) Filed: Oct. 30, 2009

(65) Prior Publication Data
US 2010/0243299 A1    Sep. 30, 2010

Related U.S. Application Data

(60) Provisional application No. 61/164,066, filed on Mar. 27, 2009.

(51) Int. Cl.
| H05K 1/00 | (2006.01) |
| H05K 1/03 | (2006.01) |
| H05K 1/09 | (2006.01) |
| H05K 1/18 | (2006.01) |
| H01L 23/538 | (2006.01) |
| H01L 23/13 | (2006.01) |
| H01L 21/48 | (2006.01) |
| H05K 3/46 | (2006.01) |
| H05K 1/02 | (2006.01) |

(52) U.S. Cl.
CPC .... *H05K 1/0271* (2013.01); *H01L 2924/01019* (2013.01); *H01L 2924/15311* (2013.01); *H01L 2924/3011* (2013.01); *H01L 2924/01079* (2013.01); *H01L 23/5383* (2013.01); *H01L 23/13* (2013.01); *H05K 2201/068* (2013.01); *H01L 21/486* (2013.01); *H01L 23/5384* (2013.01); *H05K 2201/0187* (2013.01); *H05K 3/4602* (2013.01); *H01L 2224/16225* (2013.01); *H01L 23/5389* (2013.01); *H05K 1/183* (2013.01); *H01L 2924/01078* (2013.01); *H05K 3/4694* (2013.01); *H01L 2924/01046* (2013.01)
USPC ........... 174/255; 174/256; 174/258; 361/761; 361/762

(58) Field of Classification Search
CPC ...................................... H05K 1/183
USPC ............................ 174/255, 262; 361/761, 762
See application file for complete search history.

(56) References Cited

U.S. PATENT DOCUMENTS 6,324,067 B1 * 11/2001 Nishiyama .................... 361/761
6,979,890 B2 * 12/2005 Kambe et al. ................. 257/678
(Continued)

FOREIGN PATENT DOCUMENTS

JP    2001-36253    2/2001
JP    2001-102479    4/2001
(Continued)

OTHER PUBLICATIONS

Machine Translations of JP 2008177502 A, JP 2008177503 A, and JP 2008177504 A provided in this Office Action along with original foreign copies.*

(Continued)

*Primary Examiner* — Chau N Nguyen
*Assistant Examiner* — Roshn Varghese
(74) *Attorney, Agent, or Firm* — Oblon, Spivak, McClelland, Maier & Neustadt, L.L.P.

(57) ABSTRACT

A multilayer printed wiring board includes a core base material having a penetrating portion, a low-thermal-expansion substrate accommodated inside the penetrating portion of the core base material and having a first surface for mounting a semiconductor element and a second surface on the opposite side of the first surface, a first through-hole conductor provided inside the low-thermal-expansion substrate and provided for electrical connection between the first surface and the second surface of the low-thermal-expansion substrate, a filler filled in a gap between the low-thermal-expansion substrate and an inner wall of the core base material, and a wiring layer formed on at least one of the first surface and the second surface of the low-thermal-expansion substrate and having a resin insulation layer and a conductive layer. The wiring layer has a via conductor connecting the first through-hole conductor and the conductive layer.

18 Claims, 27 Drawing Sheets

(56) References Cited

U.S. PATENT DOCUMENTS

| | | | |
|---|---|---|---|
| 7,230,818 B2 * | 6/2007 | Noguchi et al. | 361/528 |
| 7,400,035 B2 * | 7/2008 | Abe et al. | 257/700 |
| 7,624,501 B2 * | 12/2009 | Machida | 29/846 |
| 8,143,531 B2 * | 3/2012 | Miki et al. | 174/260 |
| 2005/0136634 A1 * | 6/2005 | Savastiouk et al. | 257/774 |
| 2006/0180341 A1 * | 8/2006 | Kariya et al. | 174/255 |
| 2006/0283547 A1 * | 12/2006 | Yuri et al. | 428/209 |
| 2007/0064375 A1 * | 3/2007 | Urashima et al. | 361/311 |
| 2009/0255716 A1 | 10/2009 | Kariya et al. | |
| 2009/0260857 A1 | 10/2009 | Kariya et al. | |

FOREIGN PATENT DOCUMENTS

| | | | |
|---|---|---|---|
| JP | 2006-253669 | | 9/2006 |
| JP | 2008177502 A | * | 7/2008 |
| JP | 2008177503 A | * | 7/2008 |
| JP | 2008177504 A | * | 7/2008 |

OTHER PUBLICATIONS

U.S. Appl. No. 12/616,891, filed Nov. 12, 2009, Kariya, et al.

* cited by examiner (A)

(B)

(C)

(D)

(E)

(A)

(B)

(C)

(D)

(E)

(A)

(B)

(A)

(B)

(C)

(A)

(B)

(C)

(A)

(B)

(A)

(B)

(C)

(A)

(B)

(C)

_US 8,829,355 B2_

MULTILAYER PRINTED WIRING BOARD

CROSS-REFERENCE TO RELATED APPLICATIONS

The present application claims the benefits of priority to U.S. Application No. 61/164,066, filed Mar. 27, 2009. The contents of that application are incorporated herein by reference in their entirety.

BACKGROUND OF THE INVENTION

1. Field of the Invention

The present invention is related to a multilayer printed wiring board with a built-in low-thermal-expansion substrate; especially to a multilayer printed wiring board preferred to be used as a packaging substrate for mounting an IC chip.

2. Discussion of the Background

Japanese Laid-Open Patent Publication 2001-102479 describes an interposer which electrically connects an IC chip and a packaging substrate. Interposer body 20 in FIG. 2 is made of silicon, via conductors 27 penetrating the silicon are connected to the electrodes of an IC chip, and a wiring layer is formed on the surface of the silicon substrate opposite the IC chip. The contents of this publication are incorporated herein by reference in their entirety.

SUMMARY OF THE INVENTION

According to one aspect of the present invention, a multilayer printed wiring board includes a core base material having a penetrating portion, a low-thermal-expansion substrate accommodated inside the penetrating portion of the core base material and having a first surface for mounting a semiconductor element and a second surface on the opposite side of the first surface, a first through-hole conductor provided inside the low-thermal-expansion substrate and provided for electrical connection between the first surface and the second surface of the low-thermal-expansion substrate, a filler filled in a gap between the low-thermal-expansion substrate and an inner wall of the core base material, and a wiring layer formed on at least one of the first surface and the second surface of the low-thermal-expansion substrate and having a resin insulation layer and a conductive layer. The wiring layer has a via conductor connecting the first through-hole conductor and the conductive layer.

According to another aspect of the present invention, a multilayer printed wiring board includes a core base material having a penetrating portion and having a first surface and a second surface on the opposite side of the first surface, a low-thermal-expansion substrate accommodated inside the penetrating portion of the core base material and having a first surface for mounting a semiconductor element and a second surface on the opposite side of the first surface, a filler filled in a gap between the low-thermal-expansion substrate and an inner wall of the core base material, a first wiring layer formed on the first surface of the low-thermal-expansion substrate and having a first insulation layer and a first conductive layer, a second wiring layer formed on the first surface of the core base material and on the first surface of the low-thermal-expansion substrate and having an opening exposing a semiconductor-mounting surface, and a through-hole conductor formed inside the core base material and provided for electrical connection between the first surface and the second surface of the core base material. The second wiring layer includes a second insulation layer and a second conductive layer laminated to the second insulation layer and has a via conductor connecting the second conductive layer and the first conductive layer.

According to yet another aspect of the present invention, a method for manufacturing a multilayer printed wiring board includes providing a core base material with a penetrating portion on a support material, mounting a low-thermal-expansion substrate with a through-hole conductor on the support material exposed through the penetrating portion of the core base material, filling a filler in a gap between the mounted low-thermal-expansion substrate and an inner wall of the core base material and securing the low-thermal-expansion substrate, laminating a conductive layer and an insulation layer on the low-thermal-expansion substrate and the core base material, while forming inside the insulation layer a via conductor that connects the conductive layer and the through-hole conductor, and after securing the low-thermal-expansion substrate, removing the support material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
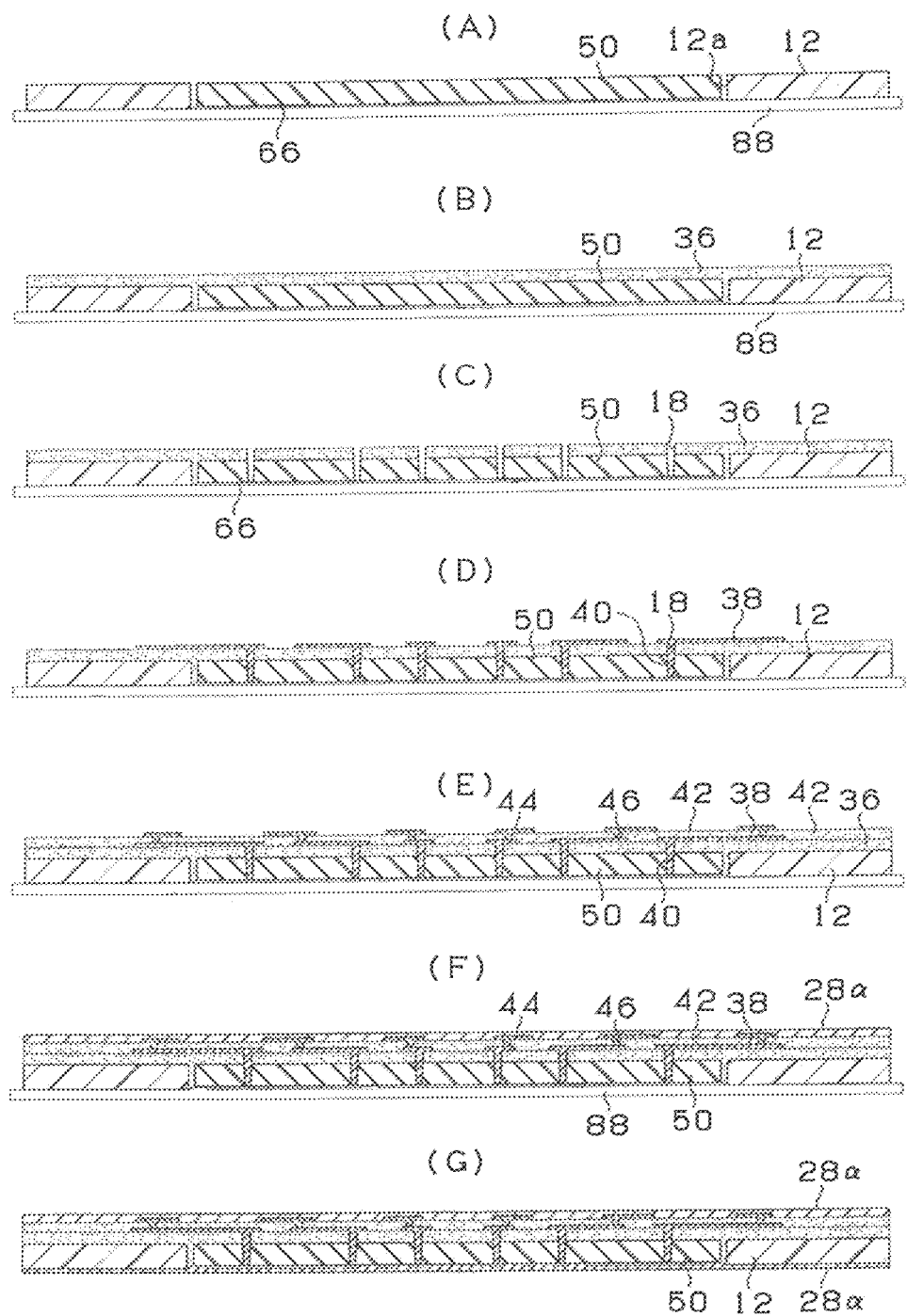
FIG. 1 are views showing the steps for manufacturing a multilayer printed wiring board according to the first example of the present invention.

The embodiments will now be described with reference to the accompanying drawings, wherein like reference numerals designate corresponding or identical elements throughout the various drawings.

First Example

A multilayer printed wiring board according to the first example of the present invention is described with reference to FIG. 3A.

In multilayer printed wiring board 10, low-thermal-expansion substrate 50, which is made of resin with an approximate thermal expansion coefficient of 3 ppm, is accommodated in penetrating section (12a) of core base material 12. On the upper-surface side (first-surface side) of low-thermal-expansion substrate 50, conductive circuits 66 are formed, and solder-resist layer (28U) is formed on conductive circuits 66. Inside solder-resist layer (28U), openings (28a) exposing parts of conductive circuits 66 are formed. Solder bumps (32U) are formed in openings (28a). Parts of conductive circuits 66 exposed through openings (28a) work as "mounting pads" for mounting a semiconductor element. The pitch between such mounting pads is set at 30-150 μm. When considering insulation between mounting pads, insulation between solder bumps (32U), distribution of a wiring layer of the semiconductor element into the wiring board and so forth, the pitch is preferred to be set at 40-80 μm. IC chip 100 and IC chip 110 are mounted by means of solder bumps (32U). However, the number of IC chips to be mounted is not limited to any specific number; namely, it may be one or it may be three or more.

Interlayer resin insulation layer 36 is formed on the lower-surface side (second-surface side) of low-thermal-expansion substrate 50 and core base material 12. Part of interlayer resin insulation layer 36 is inside penetrating section (12a) of core base material 12 and fixes low-thermal-expansion substrate 50 inside penetrating section (12a). Conductive circuits 38 are formed on interlayer resin insulation layer 36. Conductive circuits 38 and conductive circuits 66 are electrically connected by means of through-hole conductors 40 that penetrate low-thermal-expansion substrate 50 and interlayer resin insulation layer 36. The diameter of through-hole conductors 40 is preferred to be set at 50-300 μm. If the diameter of through-hole conductors 40 is in such a range, an increase in self inductance is suppressed and the number of ground lines and power-source lines that can be arranged in a limited region is ensured. Accordingly, the entire inductance generated from forming multiple ground lines and power-source lines may be reduced. The pitch among through-hole conductors 40 is preferred to be set at 30-200 μm. If the pitch of through-hole conductors 40 is in such a range, insulation between adjacent through-hole conductors 40 may be ensured. In addition, if such through-hole conductors are used for power-source and ground lines, loop inductance may decrease and excellent electrical characteristics may be achieved.

Also, through-hole conductors 40 are formed in a zigzag or grid array. If the diameter of through-hole conductors 40 becomes smaller (for example, 100 μm or smaller), conductor resistance rises and the amount of heat generated in through-hole conductors 40 increases. Thus, by forming through-hole conductors 40 in a zigzag or grid array, distribution of temperature in low-thermal-expansion substrate 50 becomes uniform and stress concentration on certain spots may be suppressed.

For the upper layer of interlayer resin insulation layer 36, interlayer resin insulation layer 42 is formed, and conductive circuits 44 formed on interlayer resin insulation layer 42 and lower-layer conductive circuits 38 are connected by means of via conductors 46 formed in interlayer resin insulation layer 42. On interlayer resin insulation layer 42, solder-resist layer (28D) is formed in which openings (28a) are formed to expose parts of conductive circuits 44. Parts of conductive circuits 44 exposed through openings (28a) are "connection pads" that contribute to electrical connection to other substrates. The pitch of connection pads is set greater than the pitch of through-hole conductors 40, namely in the range of 50-300 μm. Connection pads are formed directly on via conductors 46 or on conductive circuits 44 extended from via conductors 46.

Figure 4:
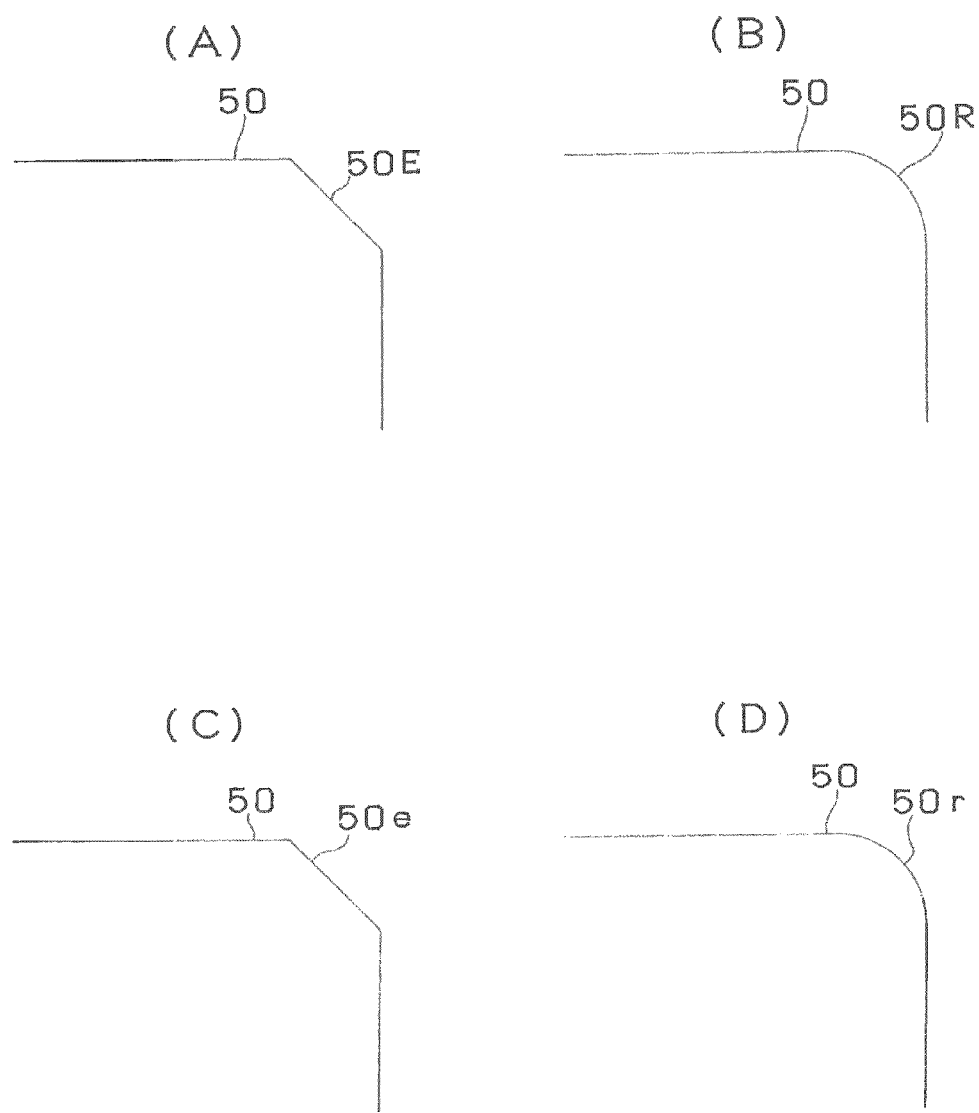
FIGS. 4A and 4C each illustrate a peripheral portion of a low-thermal-expansion substrate in a multilayer printed wiring board according to the first example.
FIGS. 4B and 4D each illustrate a peripheral portion of a low-thermal-expansion substrate according to the first modified example of the first example.

Solder bumps (32D) are formed on such connection pads. By means of solder bumps (32D), multilayer printed wiring board 10 is mounted on another printed wiring board which is not shown in the drawing. FIG. 4A shows tapered surface (50E) formed between the upper and side surfaces of low-thermal-expansion substrate 50; and FIG. 4C shows tapered surface (50e) formed between the side surfaces of the low-thermal-expansion substrate.

Figure 2:
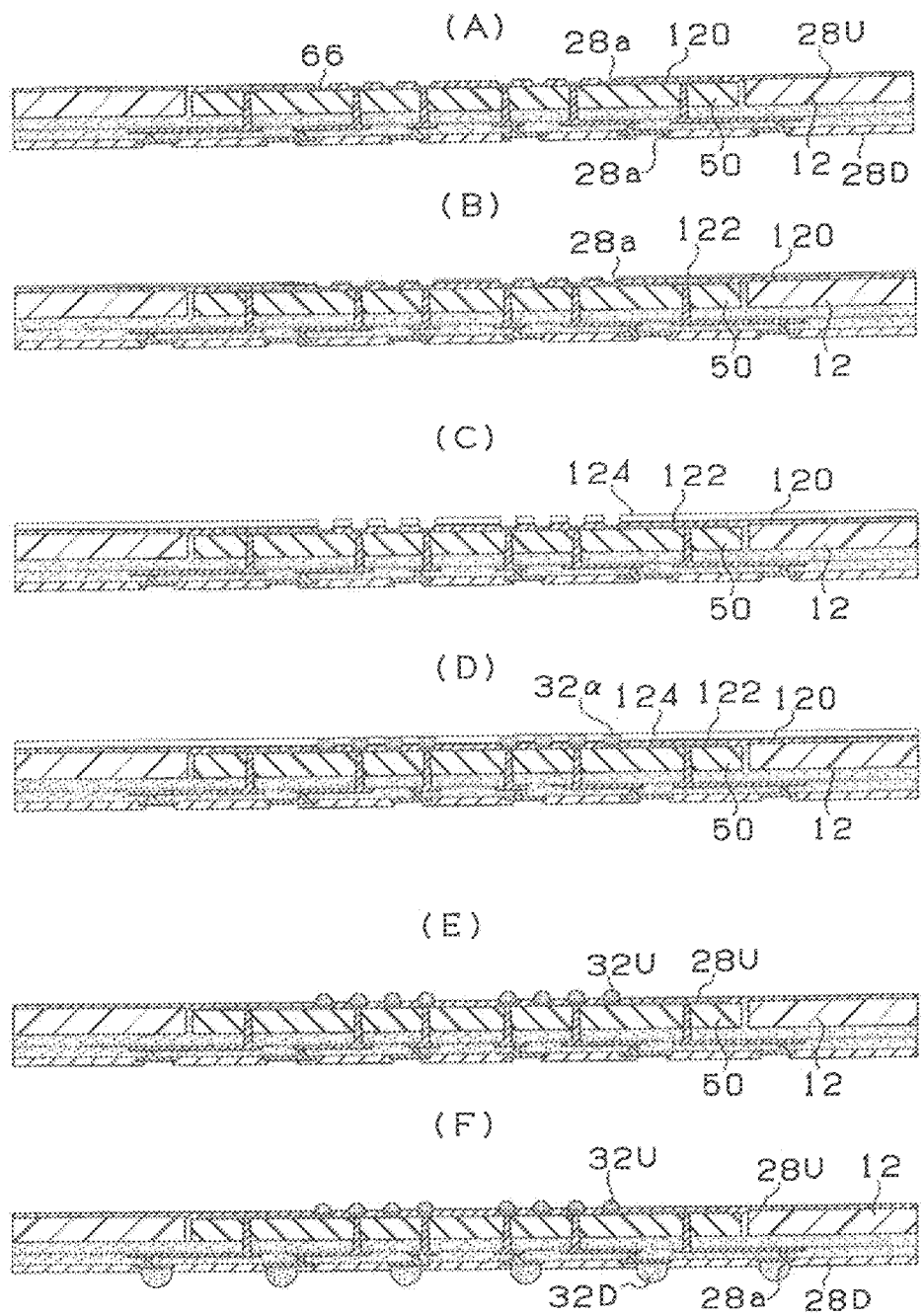
FIG. 2 are views showing the steps for manufacturing a multilayer printed wiring board according to the first example.

A method for manufacturing a multilayer printed wiring board according to the first example is described with reference to FIGS. 1 and 2 showing the manufacturing steps.

First, as shown in FIG. 1A, low-thermal-expansion substrate 50 (brand name XENOMAX made by Toyobo Co., Ltd.) having conductive circuits 66 formed on its lower surface is accommodated in a penetrating section of core base material 12 placed on PET film 88. Here, core base material 12 is formed by laminating multiple sheets of prepreg, which is made by impregnating an approximately 0.8-mm thick core such as glass fabric with resin such as epoxy or bismaleimide triazine (BT) resin and by curing such resin.

Next, resin film for interlayer resin insulation layers (brand name ABF-45SH, made by Ajinomoto Fine-Techno Co., Inc.) is placed on low-thermal-expansion substrate 50 and core base material 12, preliminarily pressed under predetermined conditions and cut to size. After that, the film is laminated using a vacuum laminator under the following method to form interlayer resin insulation layer 36. During that time, part of interlayer resin insulation layer 36 is filled in the penetrating section (FIG. 1B).

Next, openings 18 are formed to penetrate interlayer resin insulation layer 36 and low-thermal-expansion substrate 50 and reach conductive circuits 66 (FIG. 1C). Openings 18 are formed using an excimer laser, UV laser or carbon-dioxide laser. For example, conditions when using a UV laser with a wavelength of 355 nm are frequency 10 kHz, pulse width 10 microseconds and number of shots 10-20.

While through-hole conductors 40 are formed by filling openings 18 with plating by a known method, conductive circuits 38 with a predetermined pattern are formed on interlayer resin insulation layer 36 (FIG. 1D). Forming through-hole conductors 40 and conductive circuits 38 is the same as forming through-hole conductors described later in the second example; first, a power-source layer is formed by electroless plating or sputtering, plating resist is formed on the power-source layer, electrolytic plating is performed on areas where the plating resist is not formed, the plating resist is removed, and the power-source layer under the plating resist is removed.

Furthermore, after interlayer resin insulation layer 42 is formed on interlayer resin insulation layer 36, conductive circuits 44 are formed on interlayer resin insulation layer 42. Then, via conductors 46 are formed to connect conductive circuits 44 and conductive circuits 38 (FIG. 1E).

Next, solder resist (28α) is applied on interlayer resin insulation layer 42 (FIG. 1F). Then, after removing PET film 88, conductive circuits are formed on the exposed first surface of low-thermal-expansion substrate 50. After that, solder resist (28α) is applied to the first surface of low-thermal-expansion substrate 50 (FIG. 1G). At that time, PET film 88 is removed first and then solder resist (28α) may be applied to both surfaces. In the following, solder resists (28α) are cured and openings (28a) are formed at predetermined spots by exposure and development (FIG. 2A).

Nickel or the like is sputtered on solder-resist layer (28U) and openings (28a) to form seed layer 122 (FIG. 2B).

Resist 124 is applied to seed layer 122 and patterned so that openings (28a) are exposed (FIG. 2C).

Electricity is passed through seed layer 122, and solder plating (32α) is formed on areas where resist 124 is not formed (FIG. 2D).

Next, after the resist is removed, reflow is conducted to form solder bumps (32U) in openings (28a) of solder-resist layer (28U) (FIG. 2E).

Solder bumps (32D) are also formed in openings (28a) of lower solder-resist layer (28D) using the above method (FIG. 2F). However, forming solder bumps (32D) may be changed to the following methods: solder paste is printed in openings (28α) and reflowed; solder balls with a required size are loaded in openings (28α) and reflowed; and so forth.

Figure 3:
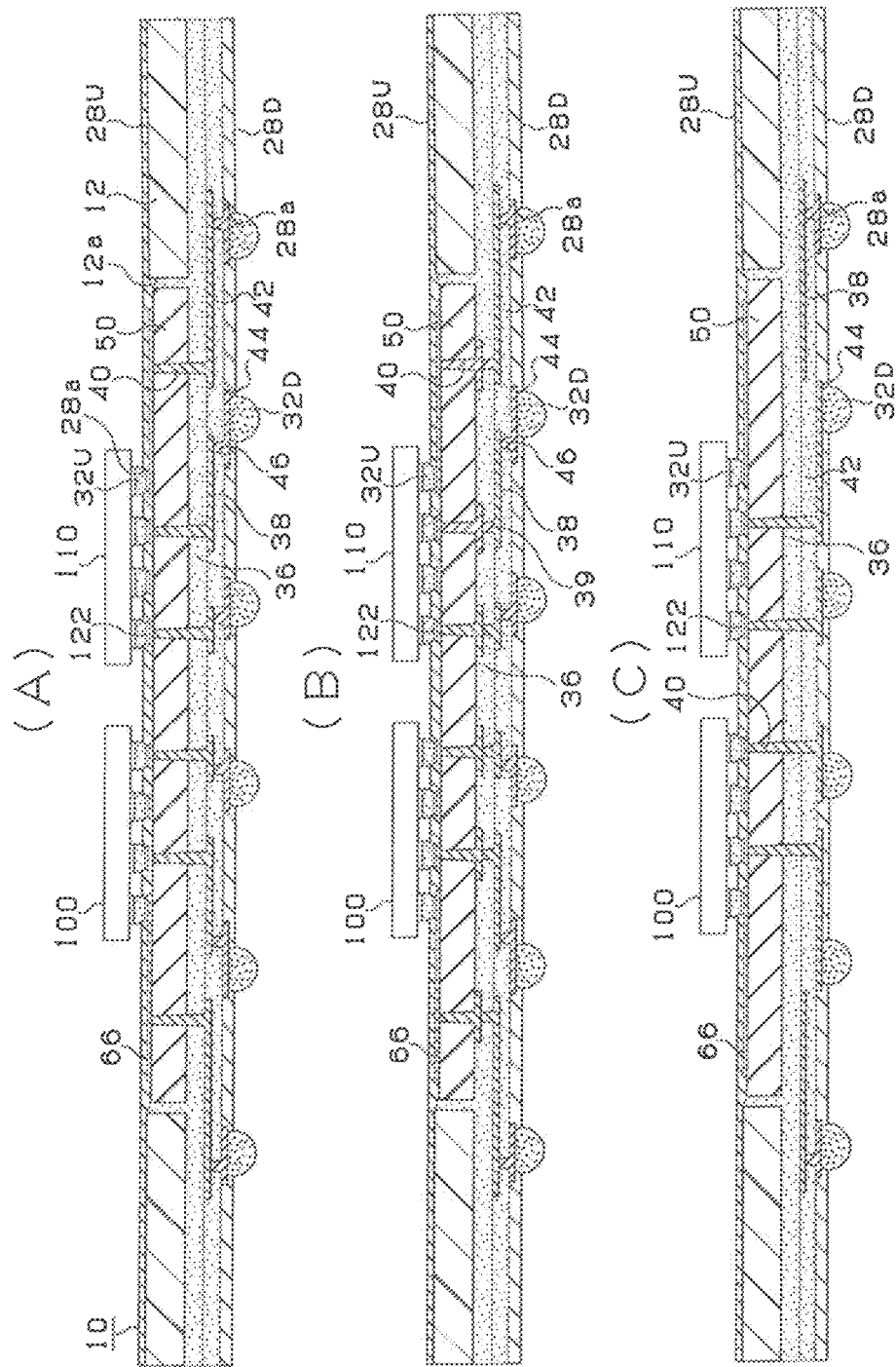
FIG. 3A is a cross-sectional view showing a multilayer printed wiring board according to the first example.
FIG. 3B is a cross-sectional view showing a multilayer printed wiring board according to the first modified example of the first example.
FIG. 3C is a cross-sectional view showing a multilayer printed wiring board according to the second modified example of the first example.

After that, IC chips 100, 110 are mounted by means of upper-surface solder bumps (32U) (FIG. 3A).

In a multilayer printed wiring board of the first example, the thermal expansion coefficient of low-thermal-expansion substrate 50 is set in the range of 2.5-10 ppm. Therefore, the difference in thermal expansion coefficients between mounted semiconductor element 100 and low-thermal-expansion substrate 50 is small, and cracks caused by thermal stress due to the difference in their thermal expansion coefficients seldom occur in solder bumps.

In a multilayer printed wiring board of the First Example, the corners of the periphery of low-thermal-expansion substrate 50 are tapered. Accordingly, cracks originating at such peripheral angles of the low-thermal-expansion substrate seldom occur.

First Modified Example of the First Example

A multilayer printed wiring board according to the first modified example of the first example is described with reference to FIG. 3B. In the first example described referring to FIG. 3A, through-hole conductors 40 penetrate core base material 12 and interlayer resin insulation layer 36. By contrast, in a multilayer printed wiring board of the first modified example of the first example, through-hole conductors 40 penetrate only low-thermal-expansion substrate 50, and conductive circuits 38 formed on interlayer resin insulation layer 36 are connected to through-hole conductors 40 by means of via conductors 39 formed in interlayer resin insulation layer 36. FIG. 4B shows rounded plane (50R) formed between the upper and side surfaces of low-thermal-expansion substrate 50 according to the first modified example of the first example; and FIG. 4D shows rounded plane (50r) formed between the side surfaces of the low-thermal-expansion substrate. Namely, low-thermal-expansion substrate 50 is formed without having angles by beveling its peripheral portions.

Second Modified Example of the First Example

A multilayer printed wiring board according to the second modified example of the first example is described with reference to FIG. 3C. In the first example described referring to FIG. 3A, through-hole conductors 40 penetrate core base material 12 and interlayer resin insulation layer 36. By contrast, in a multilayer printed wiring board of the second modified example of the first example, through-hole conductors 40 penetrate low-thermal-expansion substrate 50, interlayer resin insulation layer 36 and interlayer resin insulation layer 42.

Third Modified Example of the First Example

In the first example described with reference to FIGS. 3A-C, low-thermal-expansion substrate 50 made of resin is used. By contrast, in a multilayer printed wiring board of the third modified example of the First Example, silicon is used as low-thermal-expansion substrate 50. In such a case, insulative film is formed on the silicon surface by a thermal oxidation treatment, for example. In the third modified example, since wiring layers may be formed on a silicon substrate having excellent flat surface characteristics, it is easier to form conductive circuits that have excellent accuracy in width and thickness. Moreover, by forming wiring layers on the surfaces with a mirror finish, uneven results when forming conductive circuits are suppressed, and dispersion in impedance may be suppressed.

Second Example

A multilayer printed wiring board according to the second example of the present invention is described with reference to FIG. 10B.

In multilayer printed wiring board 10, low-thermal-expansion substrate 150, which is the same as in the first example, is accommodated in penetrating section (12a) of core base material 12. Through-hole conductors 158 are formed inside low-thermal-expansion substrate 50. Interlayer resin insulation layer 136 is formed on the upper layer (on the first surface) of low-thermal-expansion substrate 50, and conductive circuits 168 are formed on interlayer resin insulation layer 136. Through-hole conductors 158 and conductive circuits 168 are connected by means of via conductors 164 formed in interlayer resin insulation layer 136. Passivation film 27 is coated on conductive circuits 168. In openings (27a) of passivation film 27, solder bumps (32U) are formed and IC chip 100 is mounted by means of solder bumps (32U).

Interlayer resin insulation layer (36D) is formed on the lower-surface side (second-surface side) of low-thermal-expansion substrate 50 and core base material 12. Conductive circuits 38 are formed on interlayer resin insulation layer (36D). Through-hole conductors 158 and conductive circuits 38 in low-thermal-expansion substrate 50 are connected by means of via conductors 40 formed in interlayer resin insulation layer (36D). Interlayer resin insulation layer (42D) is formed on interlayer resin insulation layer (36D), and conductive circuits 44 formed on interlayer resin insulation layer (42D) and lower-layer conductive circuits 38 are connected by means of via conductors 46 formed in interlayer resin insulation layer (42D). Solder-resist layer (28D) is formed on interlayer resin insulation layer (42D), and solder bumps (32D) are formed in openings (28a) of solder-resist layer (28D). Multilayer printed wiring board 10 is connected to another printed wiring board, which is not shown in the drawing, by means of solder bumps (32D).

Figure 5:
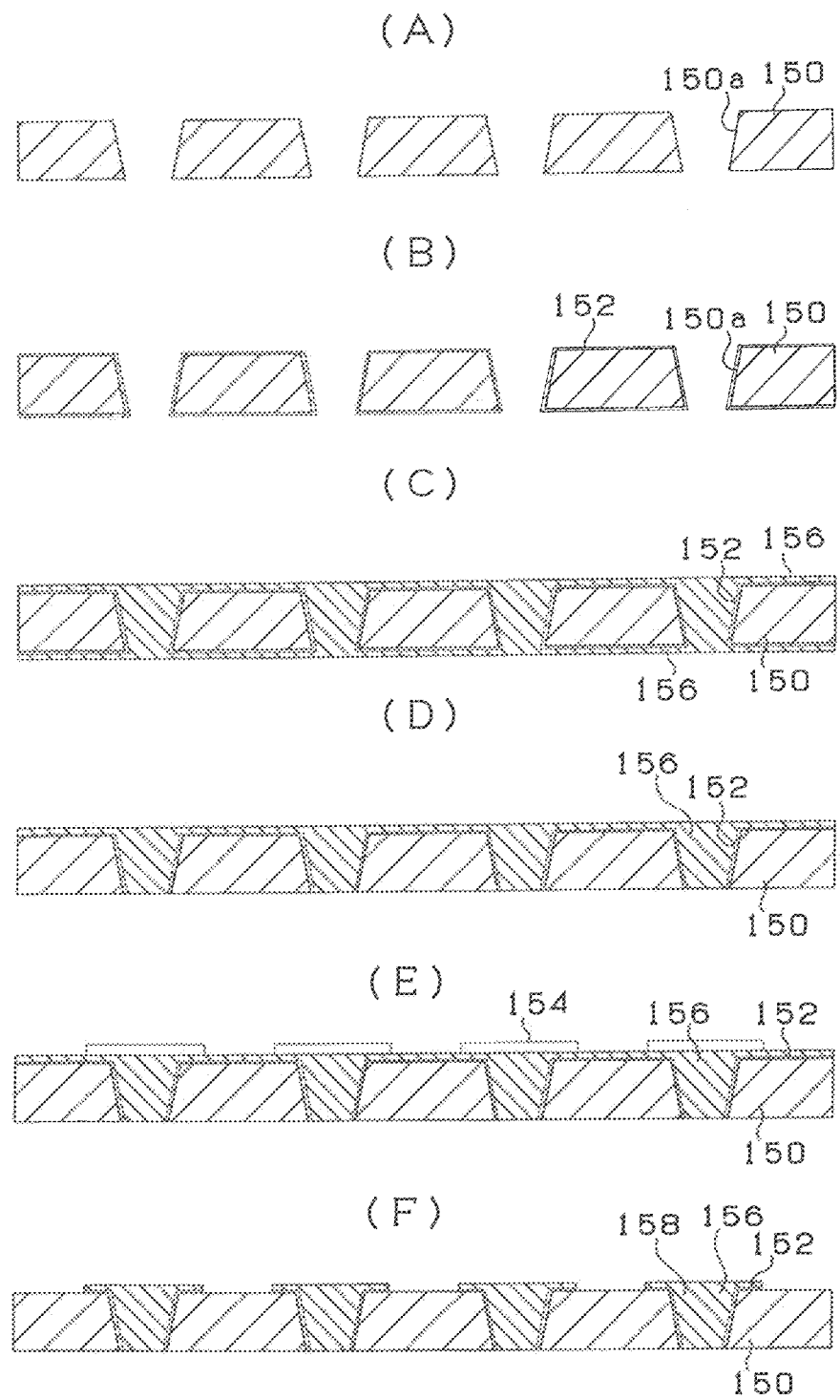
FIG. 5 are views showing the steps for manufacturing a low-thermal-expansion substrate in a multilayer printed wiring board according to the second example of the present invention.
Figure 6:
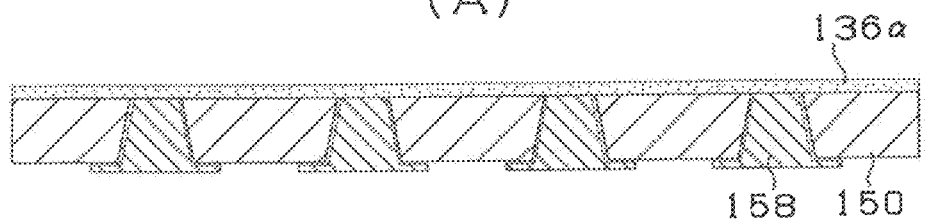
FIG. 6 are views showing the steps for manufacturing a low-thermal-expansion substrate in a multilayer printed wiring board according to the second example.
Figure 6:
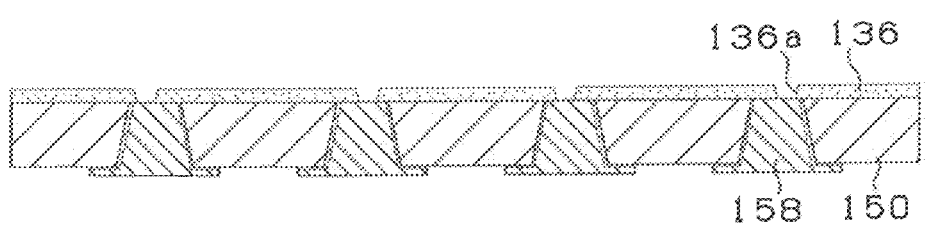
Figure 6:
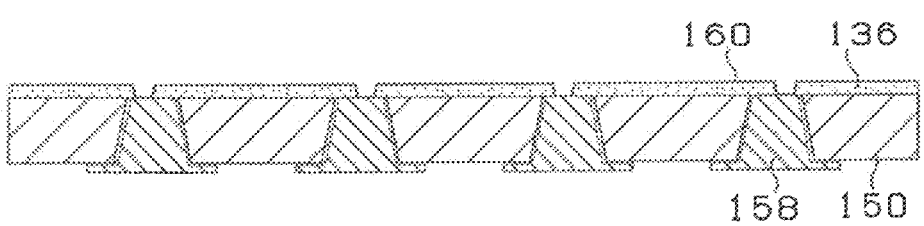
Figure 6:
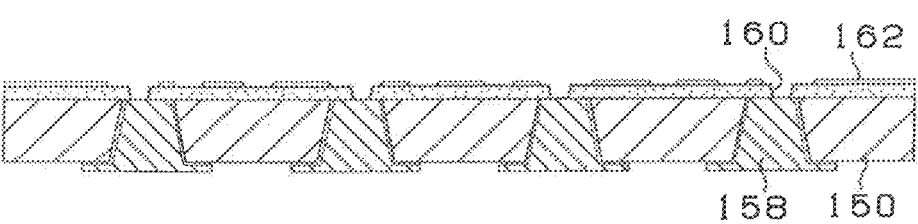
Figure 6:
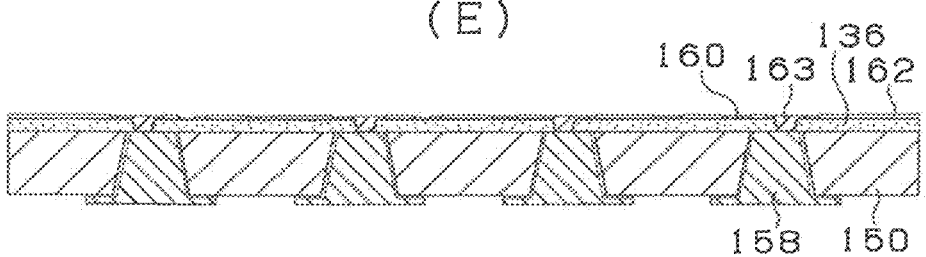
Figure 7:
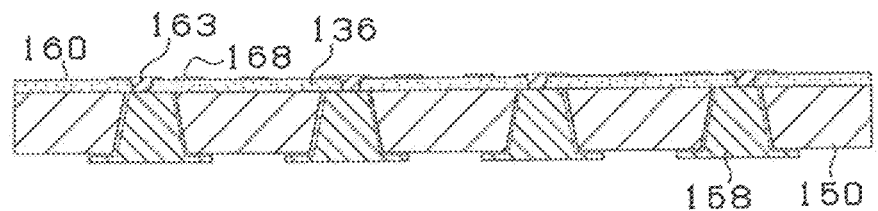
FIG. 7 are views showing the steps for manufacturing a low-thermal-expansion substrate in a multilayer printed wiring board according to the second example.
Figure 7:
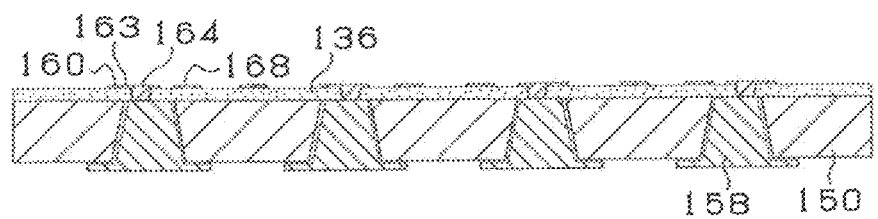
Figure 7:
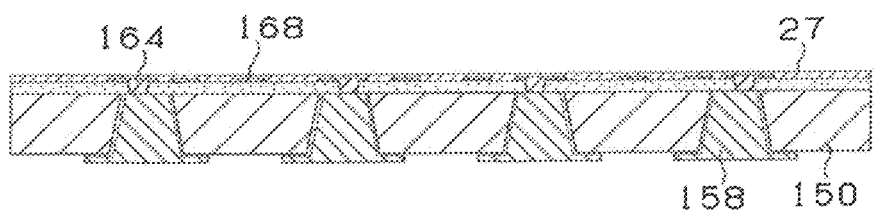
Figure 7:
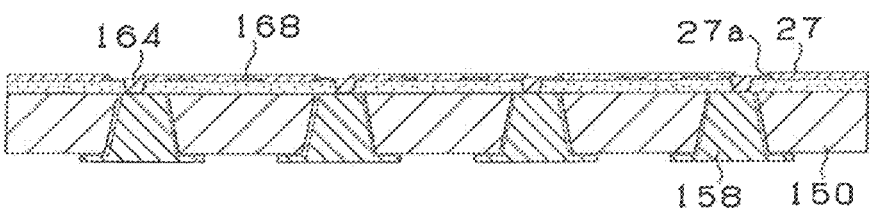
Figure 7:
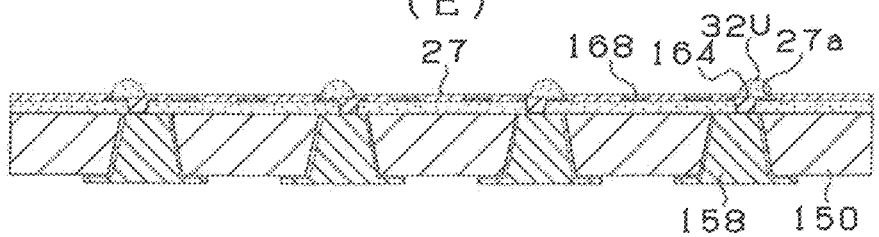

A method for manufacturing low-thermal-expansion substrate 50 of a multilayer printed wiring board in the Second Example is described with reference to FIGS. 5-7 showing the manufacturing steps.

Figure 10:
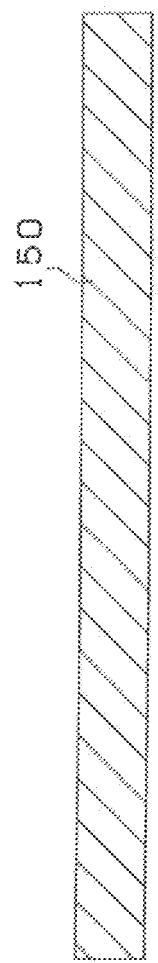
FIG. 10A is a cross-sectional view showing a resin substrate that forms a low-thermal-expansion substrate of the second example.
FIG. 10B is a cross-sectional view showing a multilayer printed wiring board according to the second example.
Figure 10:
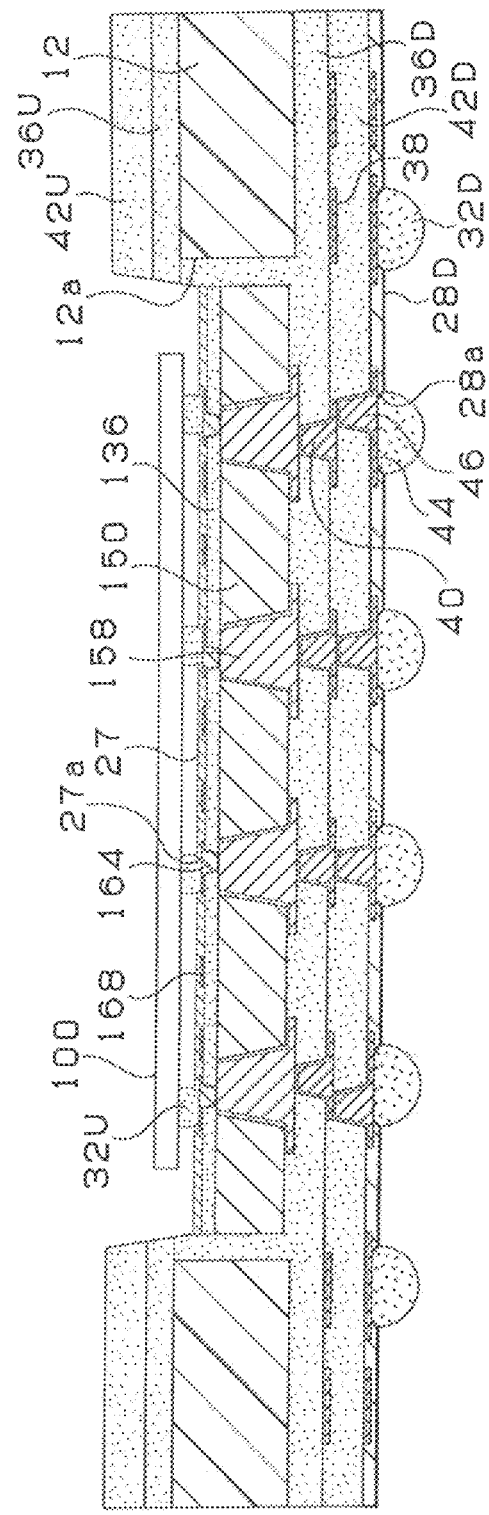

As shown in FIG. 10A, inside low-thermal-expansion substrate 150 made of resin the same as in the first example, through-hole openings (150a) are formed using a UV laser with a wavelength of 355 nm under the conditions of frequency 10 kHz, pulse width 10 microseconds and number of shots 10-20 (FIG. 5A).

Seed layer 152 is formed by electroless copper plating on the surfaces of low-thermal-expansion substrate 150 including openings (150a) (FIG. 5B).

Then, electrolytic copper plating is performed using seed layer 152 as a plating lead, electrolytic copper plating is filled in openings (150a), and electrolytic copper-plated layers (156) are also formed on the surfaces of low-thermal-expansion substrate 150 (FIG. 5C).

By polishing the electrolytic copper-plated layer on the lower side of low-thermal-expansion substrate 150, the lower surface of low-thermal-expansion substrate 150 is exposed (FIG. 5D). Resist 154 is formed on electrolytic copper-plated layer 156 on the upper side of low-thermal-expansion substrate 150 (FIG. 5E). Then, portions of the electrolytic copper-plated layer where resist 154 is not formed are removed by etching (FIG. 5F).

Substrate 150 is inverted and interlayer resin insulation layer (136α) is formed on the surface which is positioned opposite the incidence plane of the laser beams (FIG. 6A). Since the first surface (polished surface), which is opposite the incidence plane of the laser beams, has excellent flatness compared with the second surface at which the laser is beamed, it is preferred to mount a semiconductor element on the first surface.

After that, openings (136a) reaching through-hole conductors 158 are formed at predetermined spots using a laser (FIG. 6B).

Seed layer 152 made of Ti, Cu or the like is formed by sputtering on the surface of interlayer resin insulation layer 136 and in openings (136a) (FIG. 6C).

Resist film is applied to seed layer 160, and the film is exposed and developed to form a predetermined pattern on resist 162 (FIG. 6D).

Electricity is passed through seed layer 162 and electrolytic copper-plated layer 163 is formed on areas where resist 162 is not formed (FIG. 6E). Then, resist 162 is removed (FIG. 7A). After that, the seed layer directly under resist layer 162 is dissolved and removed, and via conductors 164 and conductive circuits 168 are formed (FIG. 7B). Here, the number of layers that form conductive circuits 168 may be two or more.

Passivation film 27 is formed on substrate 150 (FIG. 7C), and openings (27a) are formed at predetermined spots (FIG. 7D). Lastly, solder bumps (32U) are formed in openings (27a) by the same method as in the first example. Accordingly, low-thermal-expansion substrate 150 is complete (FIG. 7E).

Figure 8:
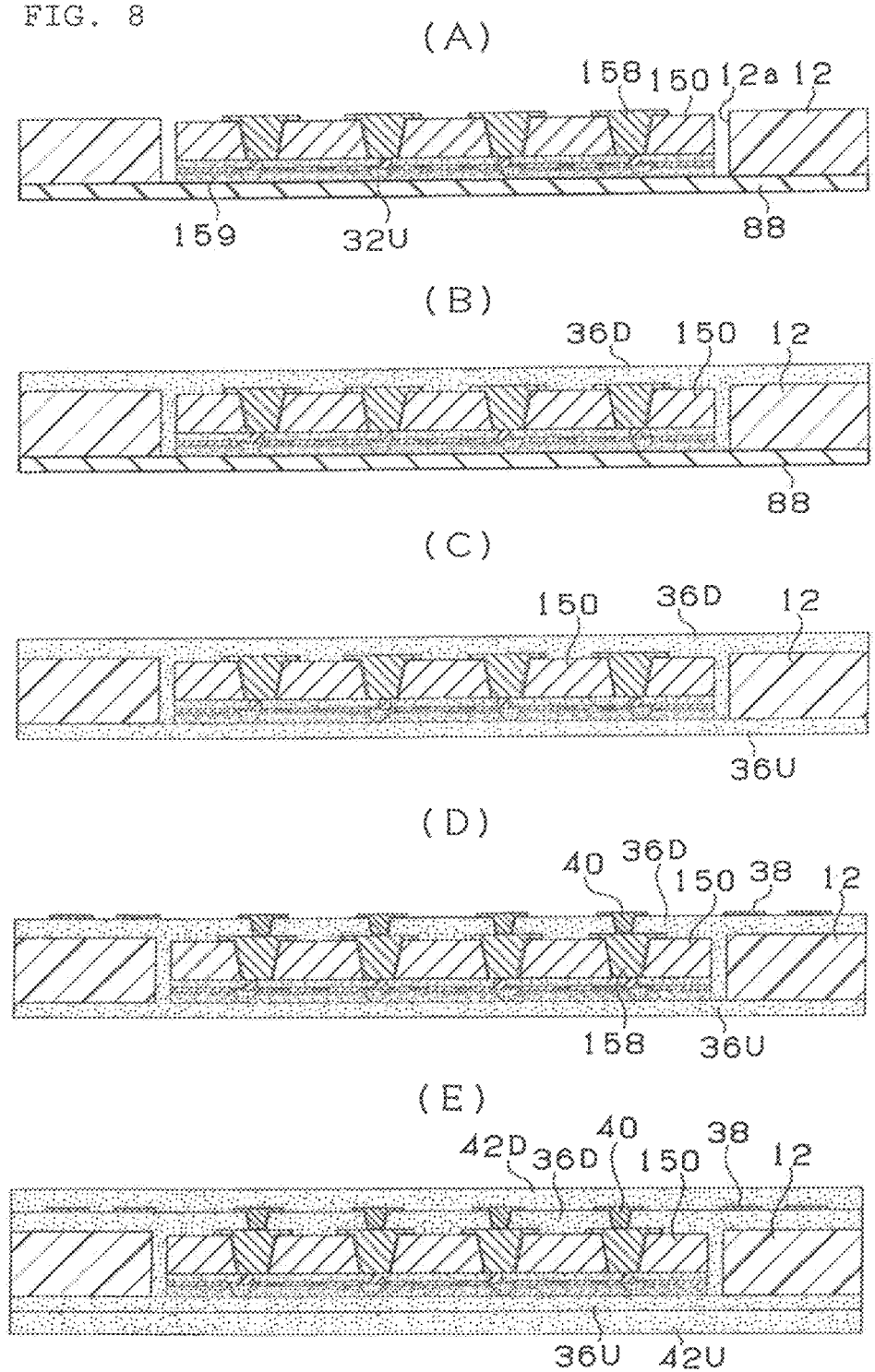
FIG. 8 are views showing the steps for manufacturing a multilayer printed wiring board according to the second example.
Figure 9:
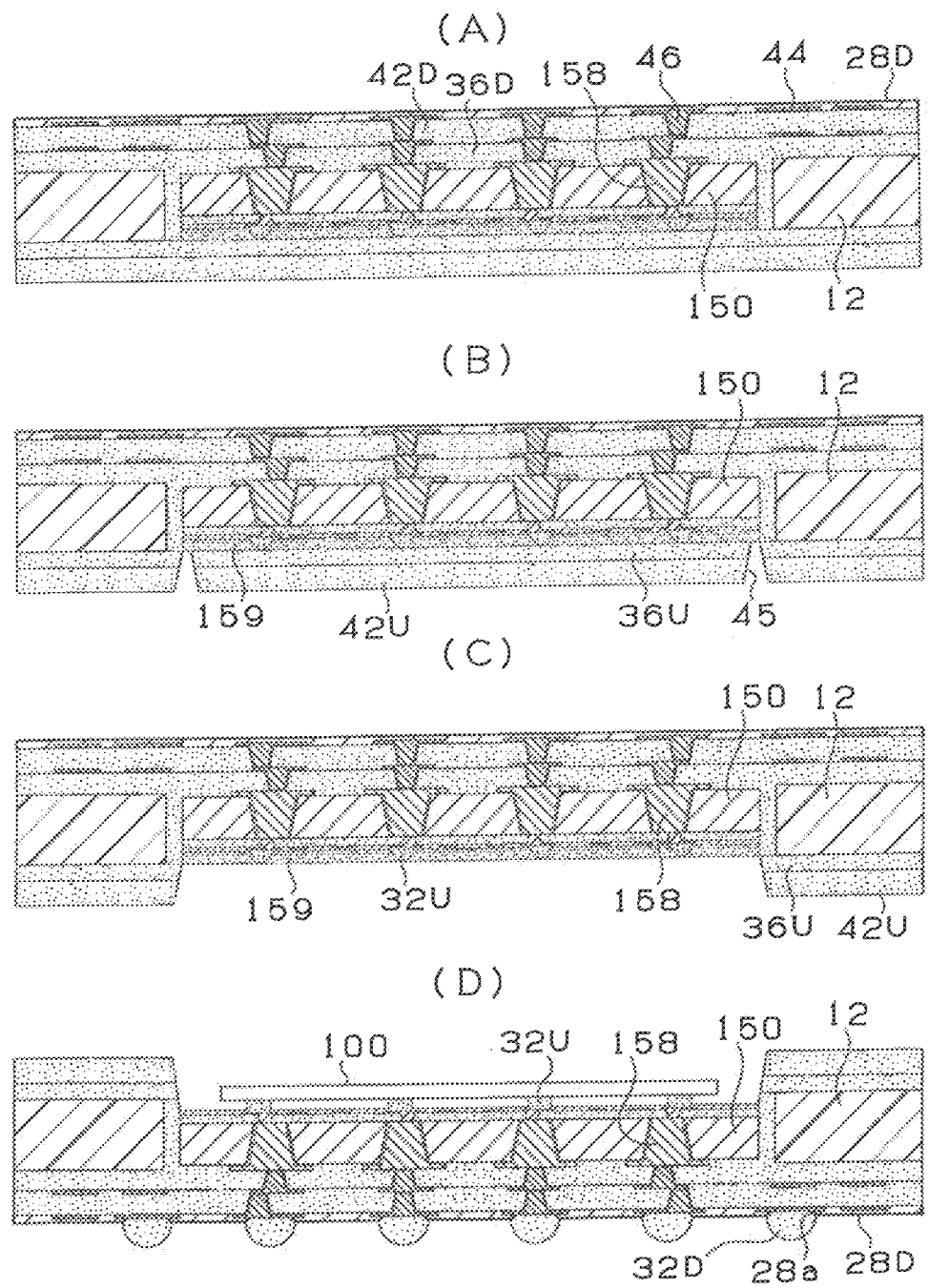
FIG. 9 are views showing the steps for manufacturing a multilayer printed wiring board according to the second example.

In the following, a method for manufacturing a multilayer printed wiring board is described with reference to FIGS. 8-9 showing the manufacturing steps.

First, in an opening of core base material 12 placed on PET film 88, low-thermal-expansion substrate 150 is accommodated so that its first surface faces downward. At that time, on the surfaces of passivation film 27 and solder bumps (32U), protective layer 159 (HT-250 made by Nissan Chemical Industries, Ltd.) is formed. Here, core base material 12, the same as in the first example, is used.

Next, resin film for interlayer resin insulation layers (brand name: ABF-45SH made by Ajinomoto Fine-Techno Co., Inc.) is placed on low-thermal-expansion substrate 150 and core base material 12, preliminarily pressed under predetermined conditions and cut to size. After that, the film is laminated using a vacuum laminator under the following method to form interlayer resin insulation layer (36D) (FIG. 8B). During that time, the film is also filled in openings (12a).

PET film 88 is removed and interlayer resin insulation layer (36U) is formed on the lower surface by laminating resin film for interlayer resin insulation layers (brand name: ABF-45SH made by Ajinomoto Fine-Techno Co., Inc.) (FIG. 8C).

Next, using a carbon-dioxide gas laser, via-hole openings reaching through-hole conductors are formed in interlayer resin insulation layer (36D) under predetermined conditions. Then, while a seed layer is formed on the surface of interlayer resin insulation layer (36D), plating resist is formed on the seed layer and electrolytic plating is performed on areas where the plating resist is not formed. After the plating resist is removed, the seed layer under the plating resist is removed. Accordingly, via conductors 40 and conductive circuits 38 are formed (FIG. 8D).

Upper interlayer resin insulation layer (42D) is formed on interlayer resin insulation layer (36D) by laminating resin film for interlayer resin insulation layers (brand name: ABF-45SH made by Ajinomoto Fine-Techno Co., Inc.) (FIG. 8E).

Then, via conductors 46 are formed in interlayer resin insulation layer (42D); and conductive circuits 44 are formed on interlayer resin insulation layer (42D). Next, solder-resist layer (28D) is formed on interlayer resin insulation layer (42D) and conductive circuits 44 (FIG. 9A).

Guide holes 45 penetrating interlayer resin insulation layers (36U, 42U) are formed by laser (FIG. 9B).

Portions of interlayer resin insulation layers (36U, 42U) corresponding to low-thermal-expansion substrate 150 are removed along guide holes 45 (FIG. 9C).

Moreover, protective layer 159 on low-thermal-expansion substrate 150 is removed and IC chip 100 is mounted by means of upper-surface solder bumps (32U) (FIG. 9D). Though not shown in the drawing, areas surrounding IC chip 100 are encapsulated with underfill resin.

First Modified Example of the Second Example

Figure 11:
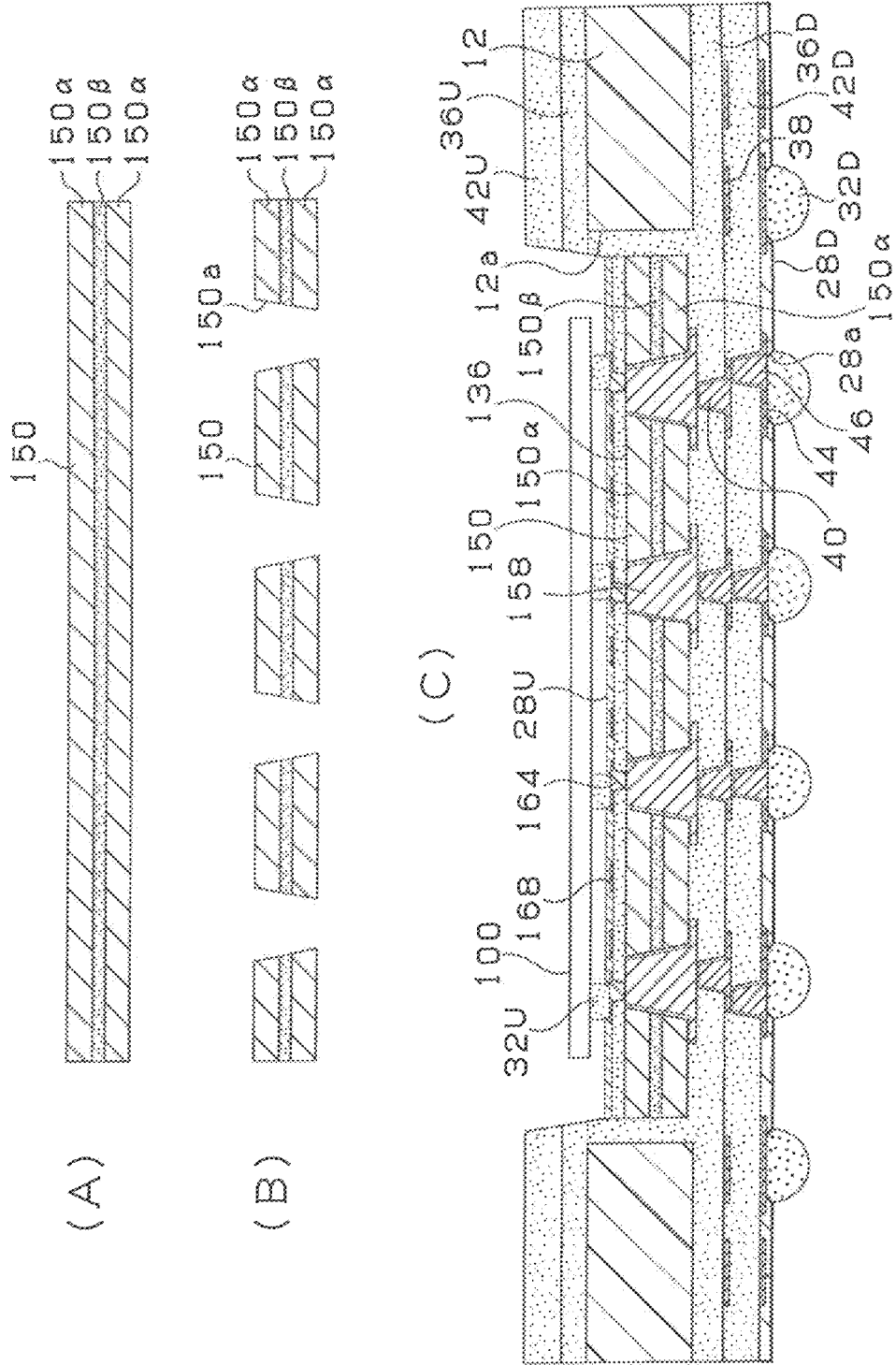
FIGS. 11A and 11B are cross-sectional views each showing a resin substrate that forms a low-thermal-expansion substrate according to a modified example of the second example.
FIG. 11C is a cross-sectional view showing a multilayer printed wiring board according to a modified example of the second example.

A multilayer printed wiring board according to the first modified example of the second example is described with reference to FIG. 11.

FIG. 11C shows a multilayer printed wiring board according to the first modified example of the second example, and FIG. 11A shows low-thermal-expansion substrate 150 to be used for the multilayer printed wiring board of the present modified example. In the second example, low-thermal-expansion substrate 150 is formed with a sheet of resin film. By contrast, in the present example, low-thermal-expansion substrate 150 is formed by a pair of resin films (150α, 150α) adhered with adhesive (150β). Through-hole openings (150a) are formed by a laser in low-thermal-expansion substrate 150 as shown in FIG. 11B. Since the rest of the manufacturing process is the same as in the Second Example described above with reference to FIGS. 5-9, its description is omitted here.

Second Modified Example of the Second Example

In the second example described above, low-thermal-expansion substrate 50 made of resin is used. By contrast, in a multilayer printed wiring board of the third modified example of the first example, silicon is used as low-thermal-expansion substrate 50. In such a case, insulative film is formed on the silicon surface by a thermal oxidation treatment, for example. In the third modified example, since wiring layers may be formed on a silicon substrate having excellent flat surface characteristics, it is easier to form conductive circuits that have excellent accuracy in width and thickness. Moreover, by forming wiring layers on the surfaces with a mirror finish, uneven results when forming conductive circuits are suppressed and dispersion in impedance may be suppressed.

Third Example

The third example is described with reference to FIGS. 12-21.

Figure 14:
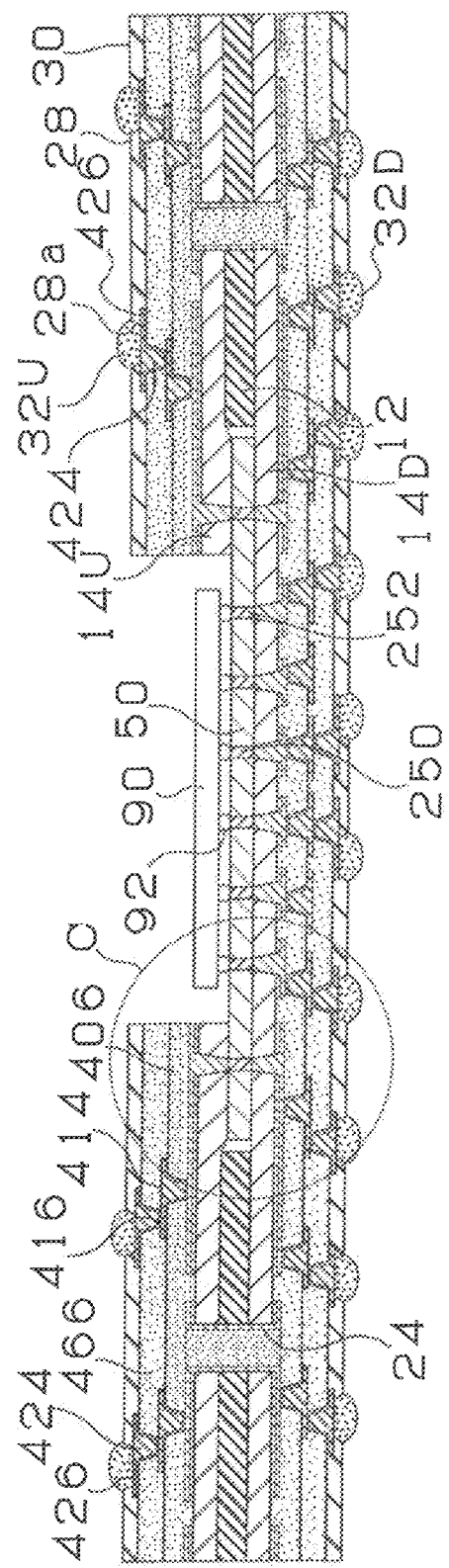
FIG. 14 is a cross-sectional view showing a multilayer printed wiring board according to the third example.

FIG. 14 shows a state in which IC chip 90 is mounted on multilayer printed wiring board 10 of the third example. Multilayer printed wiring board 10 has a low-thermal-expansion substrate with a low CTE on which to mount IC chip 90. In the third example, penetrating electrodes 250 that penetrate from the upper surface to the lower surface are formed in low-thermal-expansion substrate 50.

Figure 15:
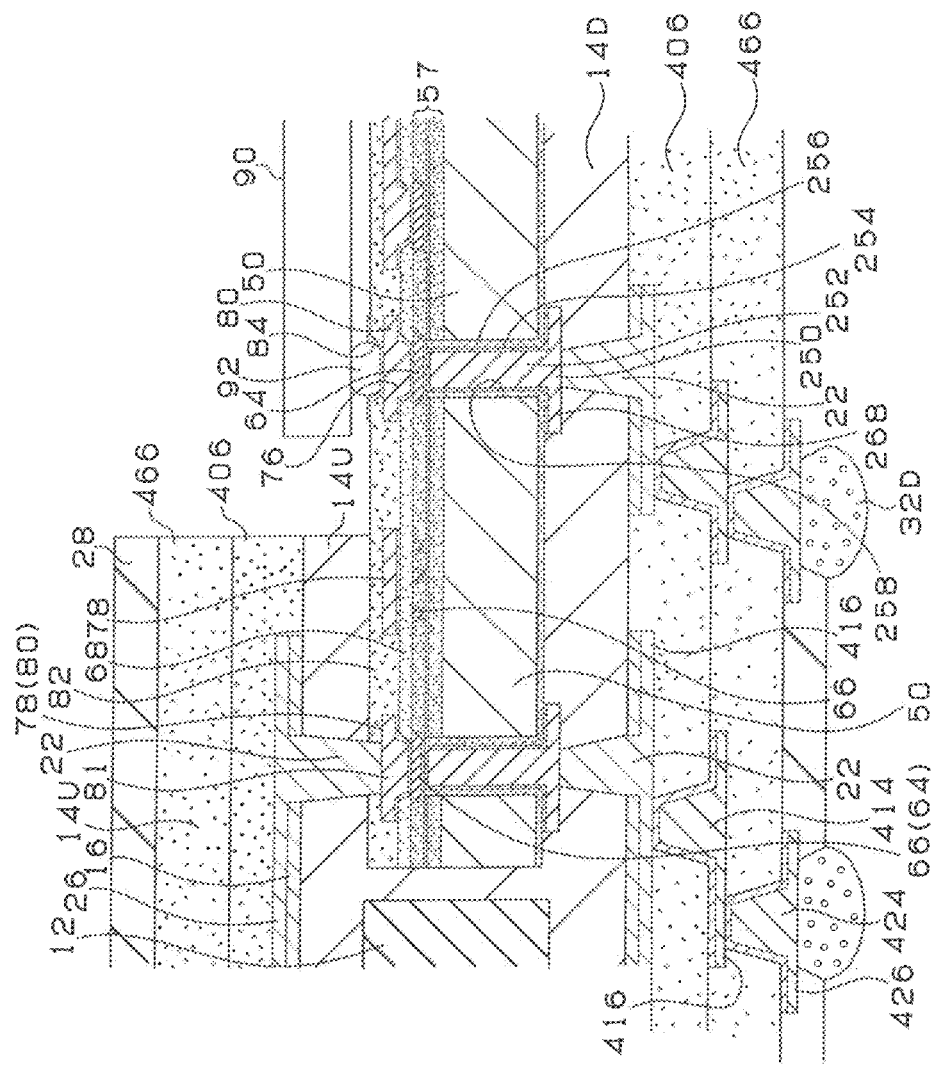
FIG. 15 is a magnified cross-sectional view showing the portion surrounded by Circle "C" in FIG. 14.
Figure 16:
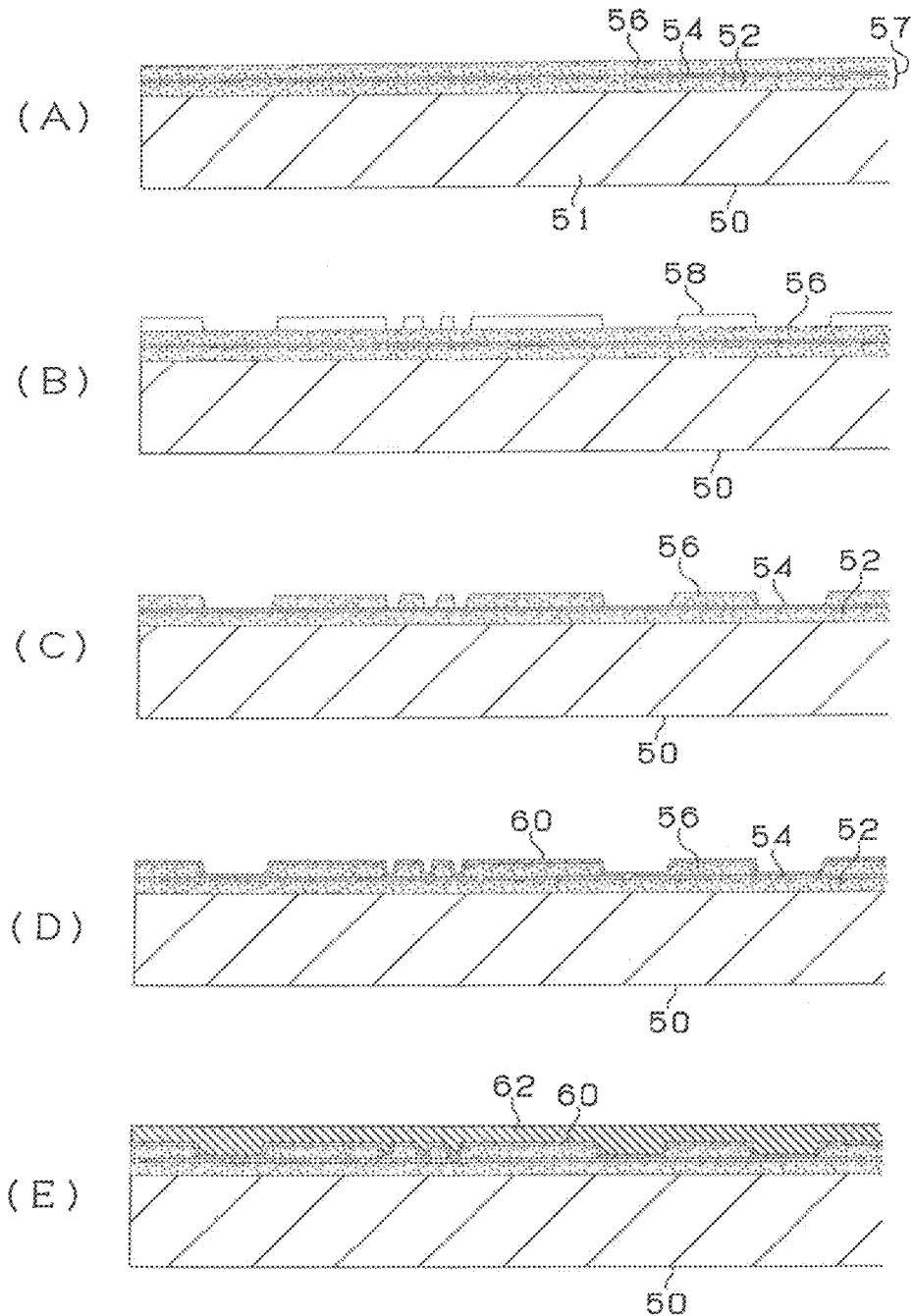
FIG. 16 are views showing the steps of a method for manufacturing a low-thermal-expansion substrate according to the third example.
Figure 17:
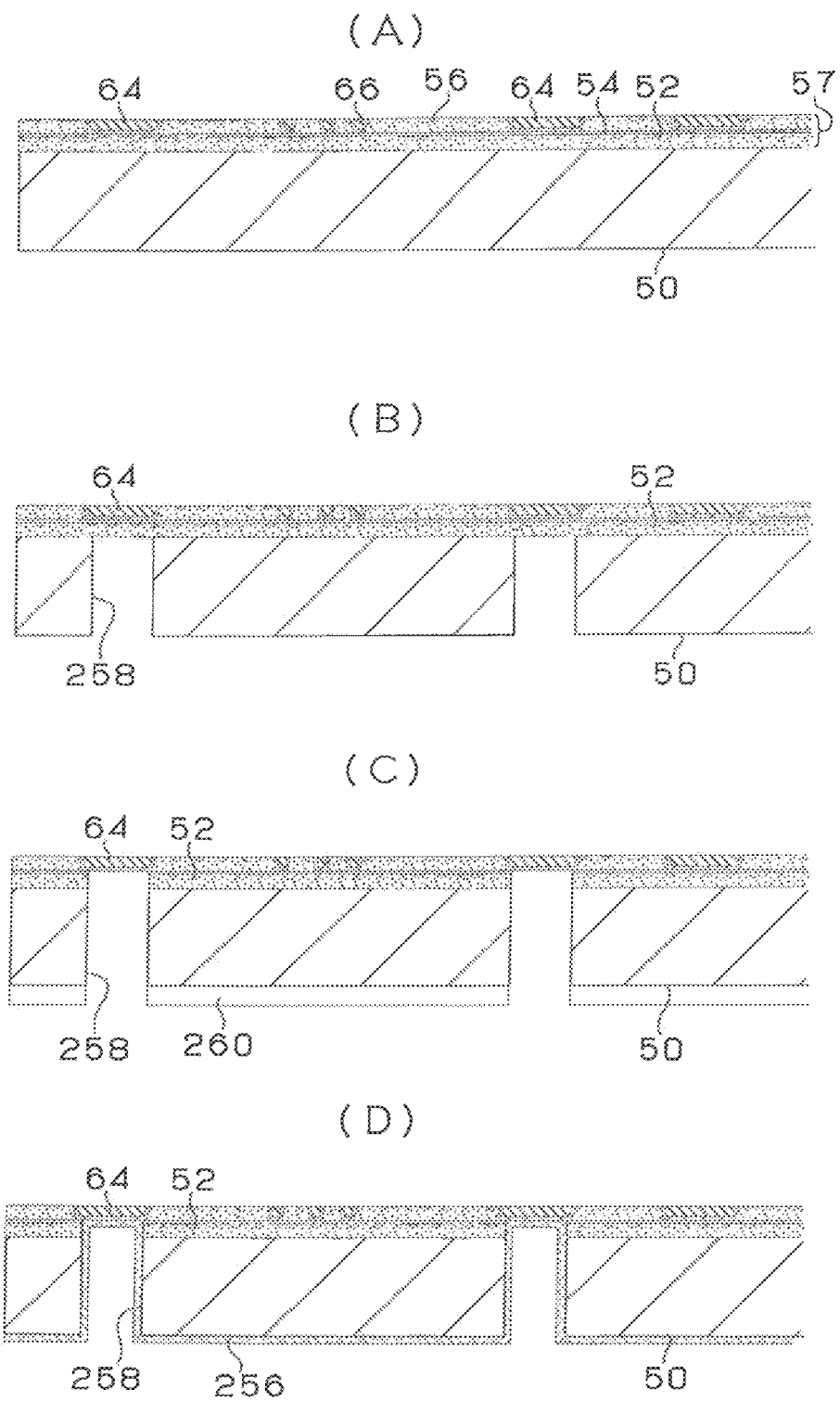
FIG. 17 are views showing the steps of a method for manufacturing a low-thermal-expansion substrate according to the third example.
Figure 18:
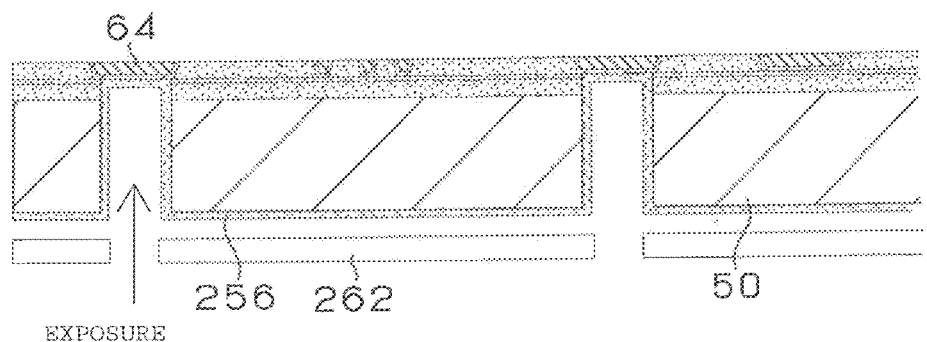
FIG. 18 are views showing the steps of a method for manufacturing a low-thermal-expansion substrate according to the third example.
Figure 18:
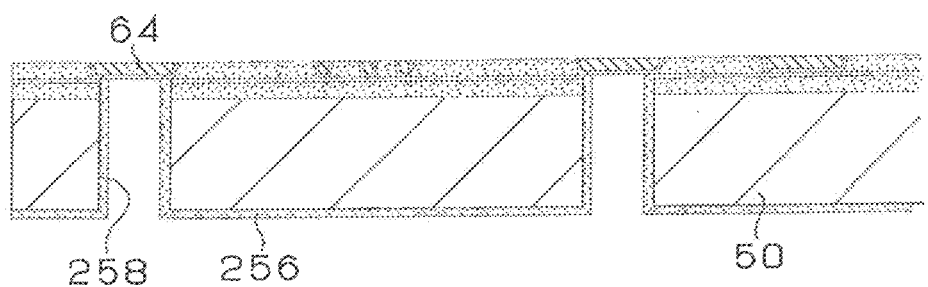
Figure 18:
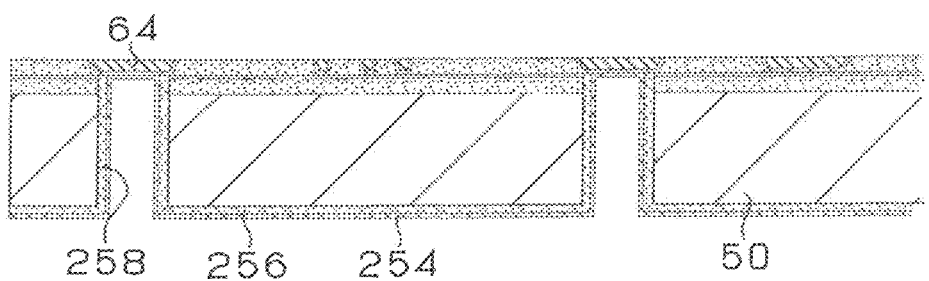
Figure 19:
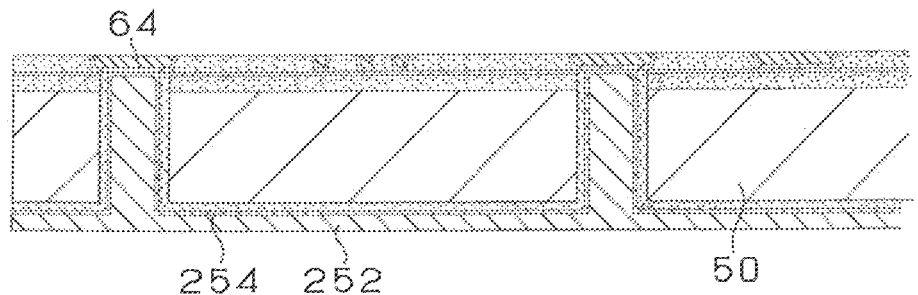
FIG. 19 are views showing the steps of a method for manufacturing a low-thermal-expansion substrate according to the third example.
Figure 19:
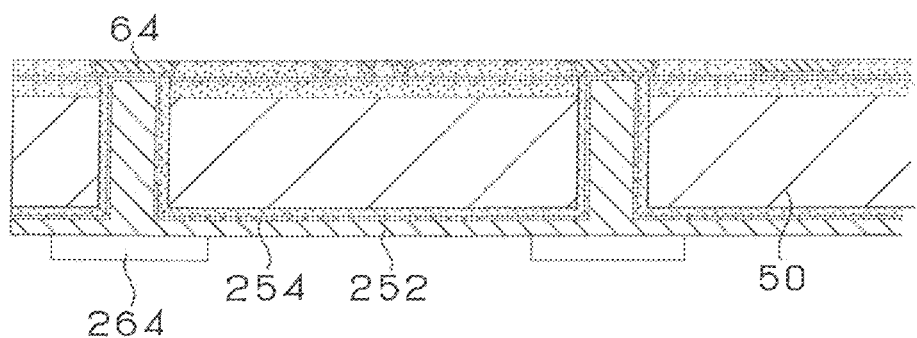
Figure 19:
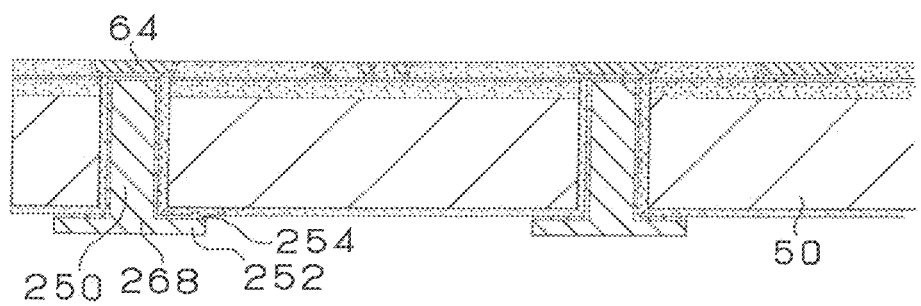
Figure 20:
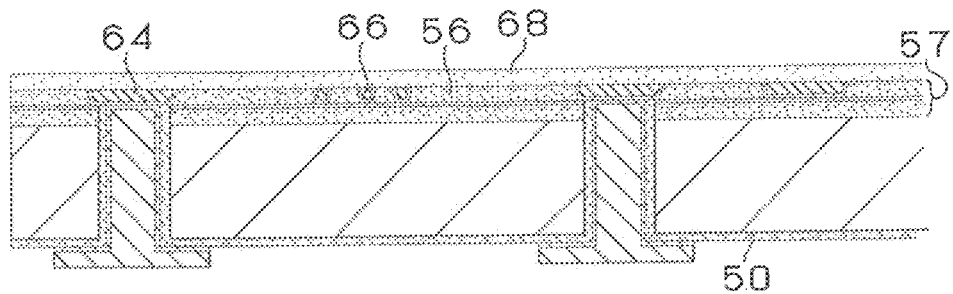
FIG. 20 are views showing the steps of a method for manufacturing a low-thermal-expansion substrate according to the third example.
Figure 20:
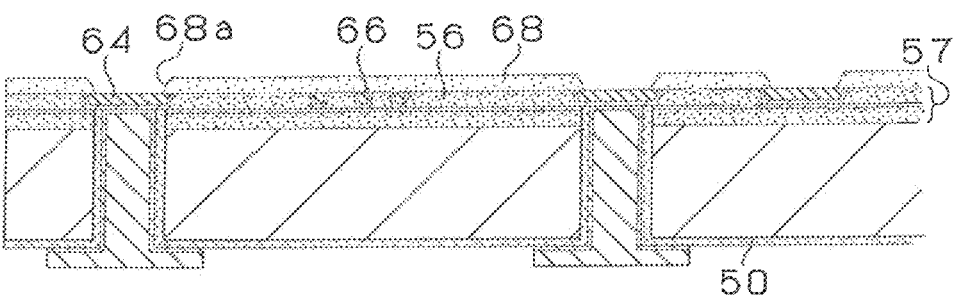
Figure 21:
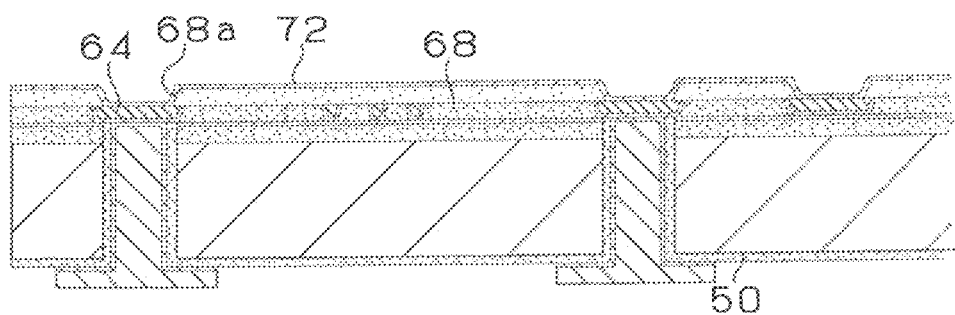
FIG. 21 are views showing the steps of a method for manufacturing a low-thermal-expansion substrate according to the third example.
Figure 21:
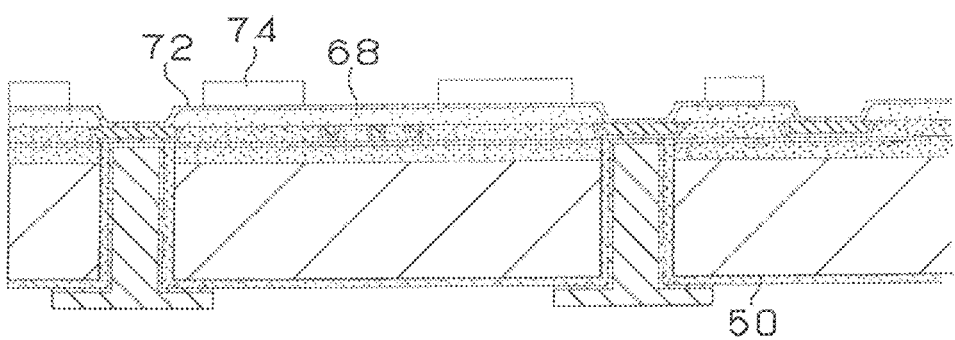
Figure 21:
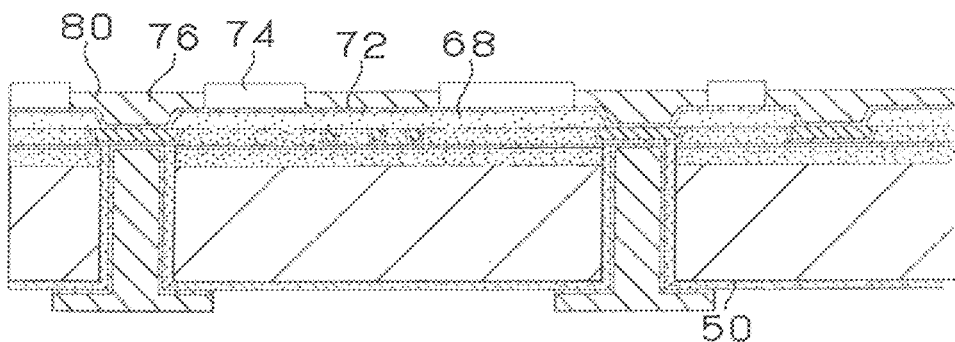
Figure 22:
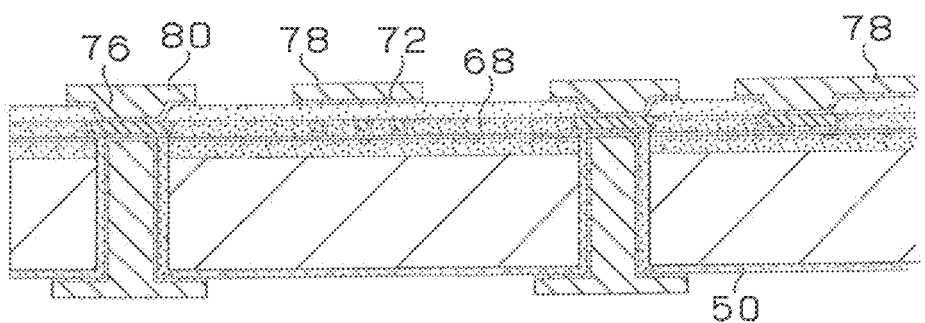
FIG. 22 are views showing the steps of a method for manufacturing a low-thermal-expansion substrate according to the third example.
Figure 22:
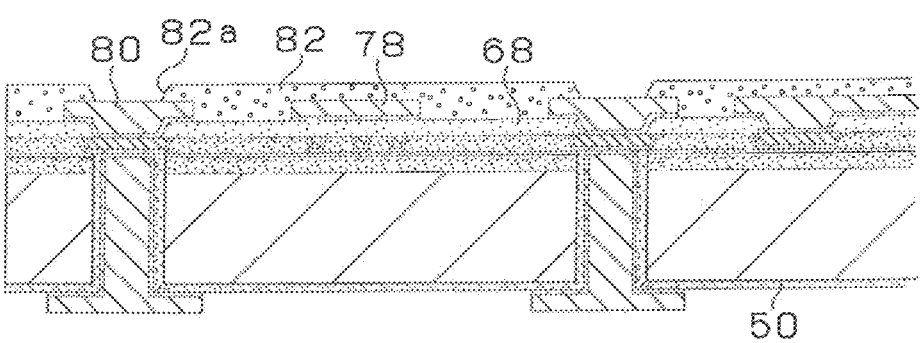
Figure 22:
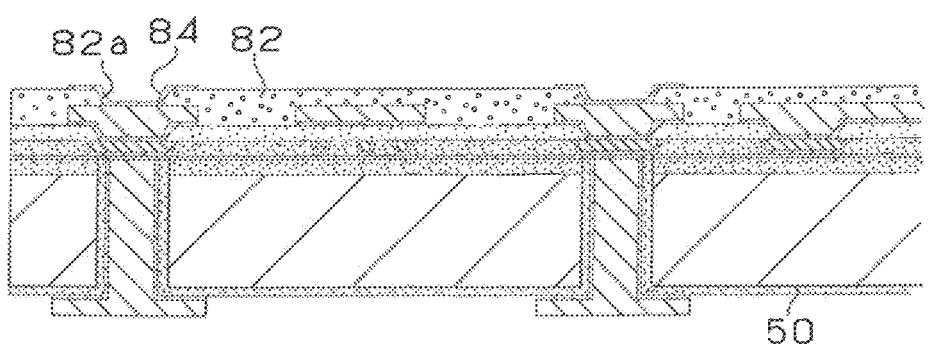

FIG. 15 is a magnified cross-sectional view showing the portion surrounded by circle "C" in FIG. 14. On the first surface of low-thermal-expansion substrate 50 according to the third example, the following are formed: inorganic insulation layer 57 made of inorganic material; first wiring 66 and via lands 64 formed inside inorganic insulation layer 57; organic insulation layer 68 made of organic material; second wiring 78 and pads 80 formed on the surface of organic insulation layer 68; and via conductors 81 as conductor portions electrically connecting first wiring 66 and second wiring 78.

Penetrating electrodes 250 are formed with copper-plated layer 252 and conductive film 254 under the copper-plated layer. Penetrating electrodes 250 and low-thermal-expansion substrate 50 are separated by insulative film 256. Insulative film 256 is also formed on the entire lower surface of low-thermal-expansion substrate 50.

The top sides (on the upper-surface side) of penetrating electrodes 250 are connected to the conductors (via lands 64 in FIG. 15) formed inside inorganic insulation layer 57. The bottom sides (on the lower-surface side) of penetrating electrodes 250 are connected to pads 268 (wiring) formed on the lower surface of low-thermal-expansion substrate 50. Namely, pads 268 (wiring) formed on the lower surface of low-thermal-expansion substrate 50 are electrically connected to first wiring 66 (via lands 64) by means of penetrating electrodes 250. Also, via conductors 22 are connected onto pads 268. Underfill resin is filled between IC chip 90 and low-thermal-expansion substrate 50 (not shown in the drawing).

In a multilayer printed wiring board according to the third example, interlayer resin insulation layers 406 with via holes 414 and conductive circuits 416, and interlayer resin insulation layers 466 with via holes 424 and conductive circuits 426 are laminated as the upper layers of upper interlayer resin layer (14U) and lower interlayer resin layer (14D).

First, low-thermal-expansion substrate 50 is described.

As for materials to form low-thermal-expansion substrate 50 according to the third example, ceramics such as silicon, silicon nitride, silicon carbide, aluminum nitride or mullite, or low-CTE resins such as polyimide (brand name: XENOMAX) may be used. Among those, silicon is preferred since silicon has highly flat surface characteristics to allow fine wiring to be formed. The thickness of low-thermal-expansion substrate 50 is not limited specifically, but it is preferred to be set in the range of 30-800 μm. If the thickness of low-thermal-expansion substrate 50 is less than 30 μm, its rigidity may not be ensured. On the other hand, if the thickness of low-thermal-expansion substrate 50 exceeds 800 μm, it is not preferred, since that would increase the entire thickness. Inorganic insulation layer 57 of the third example is made of inorganic material such as $SiO_2$ (silicon dioxide) or Si3N4 (silicon nitride). An example of a specific layer structure will be outlined in the paragraphs describing a method for manufacturing a low-thermal-expansion substrate of the third example.

In inorganic insulation layer 57, multiple via lands 64 and first wiring 66 to electrically connect predetermined via lands 64 are formed. Namely, via lands 64 connected to via conductors are formed in part of first wiring 66 which is formed inside inorganic insulation layer 57, and predetermined via lands 64 are connected by first wiring 66.

First wiring 66 is formed inside inorganic insulation layer 57 in such a way that the surface of first wiring 66, including the surfaces of via lands 64, is positioned at substantially the same level as the surface of inorganic insulation layer 57. The thickness of first wiring 66 is less than the thickness of later described second wiring. The thickness of first wiring 66 of the third example is not limited to specifically, but it is preferred to be set at 2 μm or less. If the thickness of first wiring 66 is 2 μm or less, finer wiring may be achieved, making it easier to adjust to highly integrated wiring inside a semiconductor element.

In addition, since first wiring 66 is formed using a damascene method, the surface made with inorganic insulation layer 57 and first wiring 66 is flat.

Also, in the third example, the diameter of via lands 64 is set larger than the diameter of via conductors 76. However, the diameter of via lands 64 may also be set substantially the same as the diameter of via conductors 76. When comparing the diameter of a via land and the diameter of a via conductor, the diameters at the surface where the via land and the via conductor come in contact with each other may be compared.

Organic insulation layer 68 of the third example is made of organic material and is formed on inorganic insulation layer 57 and first wiring 66. Organic insulation layer 68 has openings (68a) which expose via lands, and via conductors 76 as conductive portions are formed in openings (68a). In addition, second wiring 78 is formed on the surface of organic insulation layer 68.

Furthermore, pads 80 are formed in parts of second wiring 78 formed on organic insulation layer 68. Second wiring 78 and first wiring 66 are electrically connected by via conductors 76. When mounting a semiconductor element, pads 80 are the portions to be connected to connection terminals of semiconductor element 90 by means of solder bumps 92 as well as the portions to be connected to via conductors 22.

Organic insulation layer 68 is a layer made with a resin from among thermosetting resins, photosensitive resins, resins with photosensitive groups attached to part of thermosetting resins, thermoplastic resins or a resin complex containing such resins or the like. Specifically, it is preferred to be made with a photosensitive polyimide resin.

Next, protective film 82 and semiconductor element 90 are described. Protective film 82 is formed on organic insulation layer 68 and second wiring 78. Protective film 82 has openings (82a) partially exposing pads 80.

The material for protective film 82 is not limited specifically, but organic material is preferred from a viewpoint of adhesiveness with organic insulation layer 68. In openings (82a), solder bumps 92 are formed with barrier-metal layer 84 in between. Semiconductor element 90 is mounted on low-thermal-expansion substrate 50 by means of bumps 92.

Other than IC chips, passive elements such as a capacitor (C), resistor (R), inductor (L) or electro-static discharge (ESD) element may further be mounted on low-thermal-expansion substrate 50. Since interlayer resin insulation layers are formed on both upper and lower surfaces of low-thermal-expansion substrate 50, low-thermal-expansion substrate 50 is made substantially symmetrical in a vertical direction. Accordingly, warping caused by the thermal history during the manufacturing process may be reduced from occurring.

In the following, a method for manufacturing a low-thermal-expansion substrate of the third example is described with reference to FIGS. 16-22 showing manufacturing steps.

First, as shown in FIG. 16A, inorganic insulation layer 57 (which is formed with first SiO2 layer 52, Si3N4 layer 54 and second SiO2 layer 56, for example) is formed on low-thermal-expansion substrate 50. As for low-thermal-expansion substrate 50 of the third example, a silicon wafer is used and on the top surface of silicon wafer 51, first SiO2 layer 52, Si3N4 layer 54 and second SiO2 layer 56 are each formed by a chemical vapor deposition (CVD) method.

Next, resist 58 is applied, exposed to light and developed. Then, portions of resist 58 are removed from predetermined spots where openings will be formed in second SiO2 layer 56 (FIG. 16B).

Next, dry etching (reactive ion etching) is performed using a gas containing fluorine, for example, $CF_4$, $SF_4$ or the like as etching gas to etch portions of second SiO2 layer 56 where resist 58 is not formed. Accordingly, a pattern such as shown in FIG. 16C is formed in second SiO2 layer 56. During such dry etching, Si3N4 layer 54 functions as an etching stopper.

Next, seed layer 60 is formed on the surface of second SiO2 layer 56 using sputtering, for example (FIG. 16D). In the third example, seed layer 60 is formed with TaN, Ta and Cu sputtered films from the bottom in that order; however, the third example is not limited to such.

Next, using seed layer 60 as a power-supply layer, electrolytic copper plating is performed to form electrolytic copper-plated layer 62 (FIG. 16E). Such electrolytic copper plating may be performed using a conventionally known method.

Next, chemical mechanical polishing (CMP) is conducted to remove electrolytic copper-plated layer 62 as well as seed layer 60 on the surface of second SiO2 layer 56 (FIG. 17A). Such CMP may be conducted using a method and equipment known in a conventional damascene method. The portions of the electrolytic copper-plated layer remaining after the CMP become via lands 64 and first wiring 66. Through the process conducted so far, inorganic insulation layer and first wiring may be formed. In addition, on the surfaces of inorganic insulation layer and first wiring, inorganic thin film such as Si3N4 may also be formed using CVD, for example. Such inorganic thin film is formed to improve adhesiveness between the organic insulation layer and inorganic insulation layer.

Next, using a UV laser, for example, openings 258 are formed at predetermined spots of low-thermal-expansion substrate 50 (FIG. 17B). Forming such openings 258 is not limited to any specific method, and dry etching (reactive ion etching), wet etching using an alkaline etchant, or the like may be employed. Then, resist 260 is patterned to expose openings 258 (FIG. 17C). After that, dry etching (reactive ion etching) is conducted using resist 260 as a mask to etch first SiO2 layer 52 and Si3N4 layer 54 in that order. Accordingly, the lower surfaces of via lands 64 are exposed.

Next, using a dip-coating method or a spin-coating method, liquid resin is coated on the lower surface of low-thermal-expansion substrate 50, and dried at approximately 200° C. for an hour to form insulative film 256 (FIG. 17D). During that time, insulative film 256 is formed on the lower surface of low-thermal-expansion substrate 50 and the wall surfaces of openings 258. As for the liquid resin to be used in that step, photosensitive resin (for example, brand name: WPR, series: 2580 made by JSR Corp.) is preferred from a viewpoint that insulative film 256 on the surfaces of via lands 64 can be easily removed as described later. More specifically, liquid resin containing the following is used: methyl-ethyl ketone 20-30 weight %; ethyl lactate 20-30 weight %; filler 15-25 weight %; novolac resin 5-15 weight %; melamine compound 1-10 weight %; phenol resin 1-10 weight %; crosslinked rubber 1-10 weight %; epoxy compound 1-5 weight %; low molecular weight phenol resin 1-5 weight %; coupling agent 0.1-3 weight %; and triazine-based photosensitive agent 0.1-3 weight %. To form organic insulative film, vacuum deposition, for example, may also be used other than a spin-coating method or dip-coating method.

Next, the substrate is exposed to light through mask 262 with openings corresponding to openings 258 (FIG. 18A). Then, the substrate is developed and the exposed portions of insulative film 256 (bottoms of openings 258) are removed (FIG. 18B). Through such a process, the lower surfaces of via lands 64 are exposed again on the lower side of low-thermal-expansion substrate 50.

Next, conductive thin film 254 is formed on the exposed lower surfaces of via lands 64 and on the surface of insulative film 256 (FIG. 18C). Conductive thin film 254 is made with Ni/Cu, for example, and formed by sputtering. Forming conductive thin film 254 is not limited to such. In addition, a method to form conductive film 254 is not limited to sputtering; for example, electroless plating may also be used. Moreover, electrolytic copper plating is performed using conductive thin film 254 as a power-source layer to form copper-plated layer 252 (FIG. 19A).

Next, resist 264 is formed on areas of copper-plated layer 252 where pads will be formed (FIG. 19B). Then, portions of copper-plated layer 252 and conductive thin film 254 where resist 264 is not formed are removed by etching (FIG. 19C). By such a process, penetrating electrodes 250 and pads 268 are formed.

In the following, forming an organic insulation layer is described. First, on inorganic insulation layer 57 and first wiring 66, organic insulation layer 68 is formed (FIG. 20A), in which openings (68a) are formed (FIG. 20B). To form organic insulation layer 68, a method of applying uncured photosensitive polyimide resin using a roll coater, for example, may be used. To form openings, an exposure and development treatment may be used.

Next, seed layer 72 is formed on the surface of organic insulation layer 68 (including the wall surfaces of openings (68a)) and top surfaces of via lands 64 exposed through openings (68a)) (FIG. 21A). Seed layer 72 is formed by sputtering, for example, and is made up of TiN, Ti and Cu in that order, for example, from the surface of organic insulation layer 68 in the third example. By using TiN to form seed layer 72, copper ion diffusion may be effectively suppressed from occurring in copper plating that forms wiring. However, the formation of seed layer 72 is not limited to the above.

Next, plating resist 74 is formed, and then exposed and developed through a mask to remove portions of plating resist 74 from areas where second wiring will be formed (FIG. 21B). As for such a plating resist, a liquid resist may be used, for example.

Then, electrolytic copper plating is performed using seed layer 72 as a power-supply layer to form copper plating in the areas where plating resist 74 was removed (FIG. 21C). In doing so, via conductors 76 are formed in organic insulation layer 68. In addition, pads 80 and second wiring 78 are formed on organic insulation layer 68.

Next, the remaining resist is removed, and seed layer 72 under the removed plating resist is etched away as well (FIG. 22A). Etching seed layer 72 is not limited to any specific method; however, dry etching (reactive ion etching) is preferred in terms of suppressing over-etching of electrolytic plated copper.

Through the steps so far, the organic insulation layer and second wiring may be formed.

In the following, further organic insulation layer 82 is formed on organic insulation layer 68. Then, openings (82a) are formed on the newly formed organic insulation layer 82. This newly formed organic insulation layer 82 will become protective film (FIG. 22B). The same material as organic insulation layer 68 may be used for organic insulation layer 82 as protective film. Also, when forming openings (82a), the same method for forming openings (68a) in organic insulation layer 68 may be used.

Next, barrier-metal layer 84 is formed in openings (82a) formed in organic insulation layer 82 (FIG. 22C). Barrier-metal layer 84 may be formed by sputtering, for example, tantalum nitride and tantalum in that order. However, the material and method for barrier-metal layer 84 are not limited to anything specific. Although omitted from being shown in the drawings, Ni/Au plating is performed on the surface of barrier-metal layer 84 exposed through the openings of the protective film. Such film is formed to ensure adhesiveness between solder and pads when later-described soldering is conducted. Protective film and barrier-metal layers are formed according to requirements.

When forming a low-thermal-expansion substrate on a silicon wafer as a support substrate, by using a silicon wafer sufficiently large for the size of a low-thermal-expansion substrate, multiple low-thermal-expansion substrates may be formed on a sheet of silicon wafer. When multiple low-thermal-expansion substrates are formed on a sheet of silicon wafer, low-thermal-expansion substrates may be divided into units by cutting the silicon-wafer sheet by dicing or the like at an appropriate time such as either before or after the process of mounting semiconductor elements. In doing so, low-thermal-expansion substrates may be efficiently manufactured.

Figure 12:
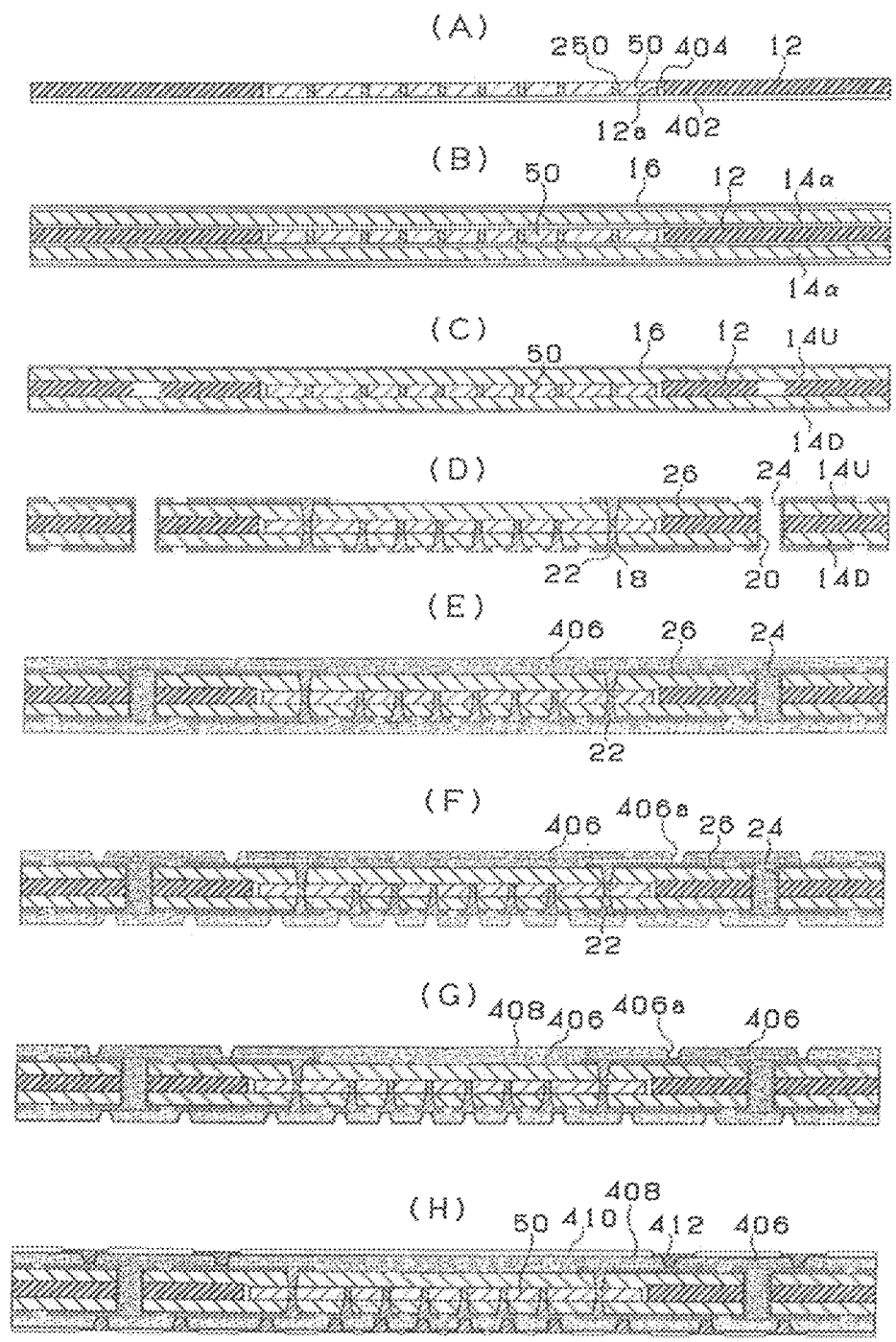
FIG. 12 are views showing the steps of a method for manufacturing a multilayer printed wiring board according to the third example of the present invention.
Figure 13:
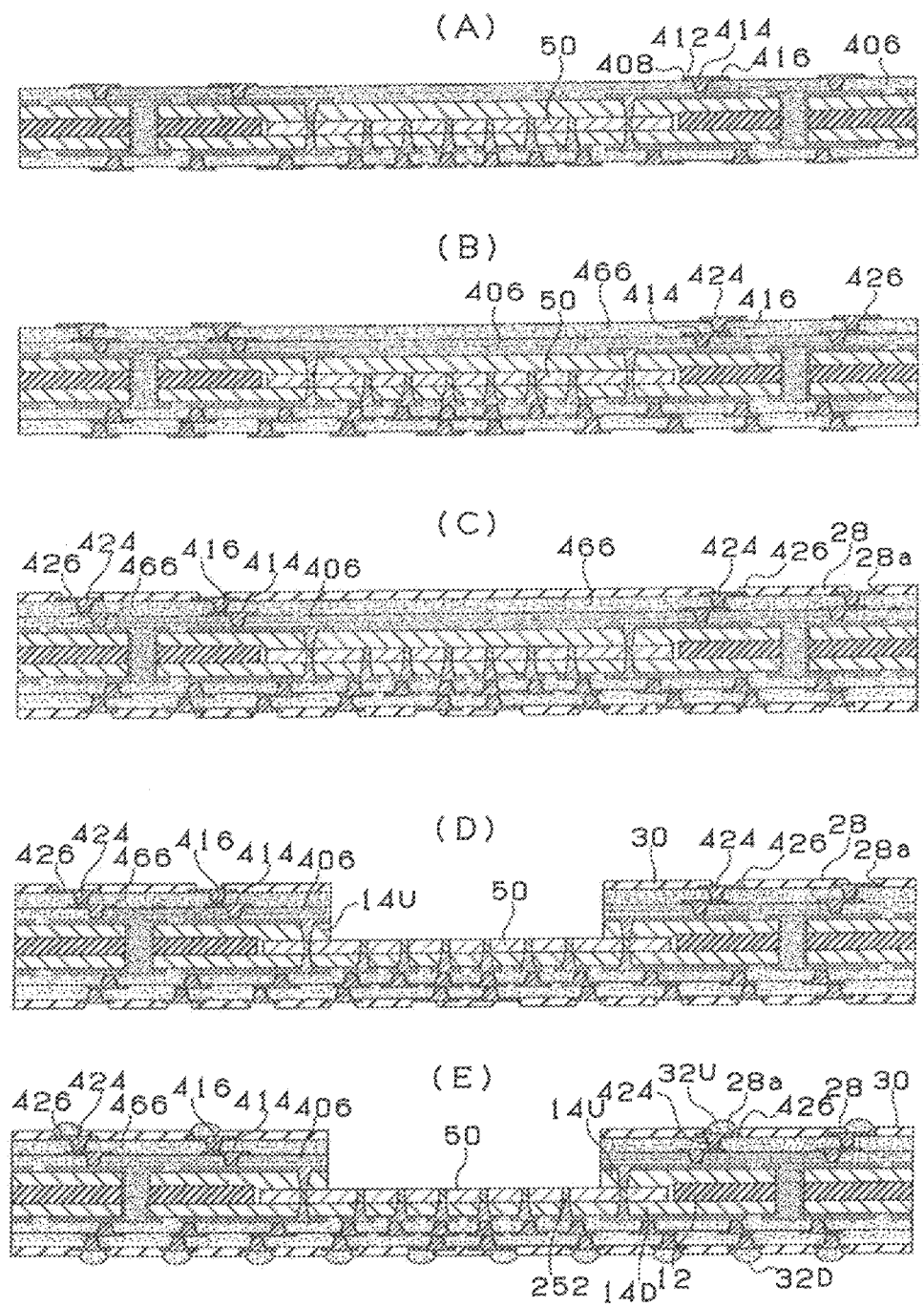
FIG. 13 are views showing the steps of a method for manufacturing a multilayer printed wiring board according to the third example.

In the following, steps of manufacturing multilayer printed wiring board 10 according to the third example are described with reference to FIGS. 12-13. First, low-thermal-expansion substrate 50 is accommodated in opening (12a) of core base material 12 mounted on PET film 402, and resin 404 is filled in the gaps between opening (12a) and low-thermal-expansion substrate 50 so that low-thermal-expansion substrate 50 is fixed to core base material 12 (FIG. 12A).

On the upper and lower sides of core base material 12 after the PET film is removed, low-flow prepreg (14α, 14α) is arranged. Then, on the outer surfaces of prepreg (14α, 14α), metal foil 16 such as copper foil is arranged (FIG. 12B). Here, core base material 12 is made by laminating multiple sheets of prepreg with a core material such as glass cloth impregnated with resin such as epoxy resin or bismaleimide triazine (BT) resin, then by curing the prepreg. Prepreg (14α) is made by impregnating core material such as glass cloth with resin such as epoxy or bismaleimide triazine (BT) resin. Low-flow prepreg (14α) is made by impregnating a certain amount of resin so that less resin will flow out, or by semi-curing the resin to a certain degree so that less resin will flow out.

Next, core base material 12, prepreg (14α, 14α) and metal foil 16 are pressed and integrated (FIG. 12C). At that time, it is also preferred to cure prepreg (14α, 14α) by adding heat to make the prepreg upper interlayer resin layer (14U) and lower interlayer resin layer (14D).

While via openings 18 are formed in interlayer resin layers (14U, 14D) by a laser, through-hole openings 20 are formed by a laser or drill to penetrate upper interlayer resin layer (14U), core base material 12 and lower interlayer resin layer (14D). Then, plated-metal film is formed by electroless copper plating and electrolytic copper plating, and via conductors 22 are formed in via openings 18 and through-hole conductors 24 are formed in through-hole openings 20 (FIG. 12D).

After filler was filled in through-hole conductors 24, resin film for interlayer resin insulation layers (brand name: ABF-45SH, made by Ajinomoto Fine-Techno Co., Inc.) which is a little larger than the substrate, was placed on the substrate, preliminarily pressurized under predetermined conditions, then cut to size. Then, the film was laminated using vacuum laminator equipment under the following conditions, and interlayer resin insulation layers 406 were formed (FIG. 12E).

Next, using a CO2 gas laser with a wavelength of 10.4 μm under predetermined conditions, via hole openings (406a) were formed in interlayer resin insulation layers 406 (FIG. 12F).

Then, the surfaces of interlayer resin insulation layers 406 including the inner walls of via-hole openings (406a) were roughened (not shown in the drawing). Such a roughening treatment is not always required.

Then, after the above treatment, the substrate was immersed in a neutralizer (made by Shipley Company LLC) and washed with water. In addition, palladium catalyst was applied to the roughened surfaces of the substrate, and catalytic nuclei were adhered to the surfaces of the interlayer resin insulation layers and the inner walls of via-hole openings.

Next, the substrate with adhered catalyst was immersed in an electroless copper plating solution to form electroless copper-plated film with a thickness of 0.3-3.0 μm on the entire roughened surface. Accordingly, a substrate was obtained in which electroless copper-plated films 408 were formed on the surfaces of interlayer resin insulation layers 406 including the inner walls of via-hole openings 51 (FIG. 12G).

Commercially available photosensitive dry film was laminated on the substrate having electroless copper-plated films 408, and the dry film was exposed to light and developed. Accordingly, plating resists 408 were formed. Then, the substrate was washed with 50° C. water to degrease it, washed with 25° C. water, and further cleansed with sulfuric acid. Then, electrolytic plating was performed to form electrolytic copper-plated films 412 with an approximate thickness of 15 μm in areas where plating resist 408 was not formed (FIG. 12H).

Furthermore, after plating resists 410 were removed by a 5% KOH solution, the electroless plating film under the plating resists was dissolved and removed by etching using a mixed solution of sulfuric acid and hydrogen peroxide. Accordingly, independent conductive circuits 416 and via holes 416 were formed (FIG. 13A).

By repeating the above procedure, further upper-layer interlayer insulation layers 466 with conductive circuits 426 and via holes 424 were formed. Accordingly, a multilayer printed wiring board was obtained (FIG. 13B).

Next, on both surfaces of the multilayer printed wiring board, a commercially available solder-resist composition was applied to a required thickness, dried, then exposed to light and developed to form openings. Then, a heating treatment was further conducted to cure the solder-resist composition, and solder-resist layers 28 with openings (28a) were formed (FIG. 13C).

(19) Next, on the conductive circuits exposed through the openings of the solder-resist layers, a nickel-plated layer (not shown in the drawings) and a gold-plated layer were formed (not shown in the drawings). Other than forming nickel-gold layers, a single layer of tin, or of noble metal (gold, silver, palladium, platinum or the like) may also be formed.

Then, interlayer resin layer (14U), interlayer resin insulation layer 406, interlayer resin insulation layer 466 and solder-resist layer 28 on low-thermal-expansion substrate 50 were removed (FIG. 13D).

Next, solder bumps (32U, 32D) are formed in openings (28) of solder-resist layers 28 (FIG. 13E). Then, IC chip 90 is mounted on low-thermal-expansion substrate 50 (FIG. 14). Solder bumps (32U) are not required here, but are required when another multilayer printed wiring board is mounted on multilayer printed wiring board 10. Also, the number of wiring layers is not limited specifically.

In the multilayer printed wiring board of the third example, built-up layers are formed on both surfaces of low-thermal-expansion substrate 50 and of core base material 12. Accordingly, the degree of latitude in distributing wiring may increase.

In multilayer printed wiring board 10 of the third example, built-up layers are formed by alternately laminating interlayer resin insulation layers (406, 466) and conductive layers (416, 426) on interlayer resin layers (14U, 14D). Thus, fine-pitch wiring distribution may be achieved.

In multilayer printed wiring board 10 of the third example, fine wiring with a fine pitch may be formed on a low-thermal-expansion substrate for mounting an IC chip. Thus, the number of wiring layers may be reduced compared with conventional multilayer printed wiring boards.

In multilayer printed wiring board 10 of the third example, since core base material 12 with a greater Young's modulus and higher rigidity than interlayer resin insulation layers is formed, warping caused, for example, by thermal history during the manufacturing process is suppressed, and reliability may be enhanced in such a multilayer printed wiring board.

In multilayer printed wiring board 10 of the third example, the thermal expansion coefficient of low-thermal-expansion substrate 50 is set at 3-10 ppm. Thus, the difference in thermal expansion coefficients between mounted semiconductor element 90 and low-thermal-expansion substrate 50 is reduced. Accordingly, cracks may seldom occur in solder bumps due to thermal stress caused by a difference in their thermal expansion coefficients.

In multilayer printed wiring board 10 of the Third Example, silicon may be used as a low-thermal-expansion substrate. In doing so, fine wiring with a fine pitch may be formed on the low-thermal-expansion substrate, and the connection reliability of solder bumps as described above may also be ensured.

In a multilayer printed wiring board of the third example, since through-hole conductors 24 are formed penetrating from the upper-surface side to the lower-surface side of core base material 12, wiring may be distributed with less restriction. Here, if through-hole conductors 24 of core base material 12 are set as signal conductors, the amount of current in such conductors is reduced, and the heat generated in the core base material will decrease. Meanwhile, through-hole conductors 250 of low-thermal-expansion substrate 50 may be used as power-source or ground conductors. In doing so, the length of power-source wiring to the IC chip may be shortened, thus decreasing impedance and ensuring smooth power supply during high-frequency drive. Moreover, since fine through-hole conductors for signals are formed in the core base material, the pitch for power-source or ground through-hole conductors formed inside low-thermal-expansion substrate 50 may be widened. Also, the size of low-thermal-expansion substrate 50 may be reduced by the size of areas for signal through-hole conductors formed in the core base material.

Fourth Example

A method for manufacturing a multilayer printed wiring board according to the fourth example is described. The structure of a multilayer printed wiring board of the fourth example is the same as that of the third example.

Figure 23:
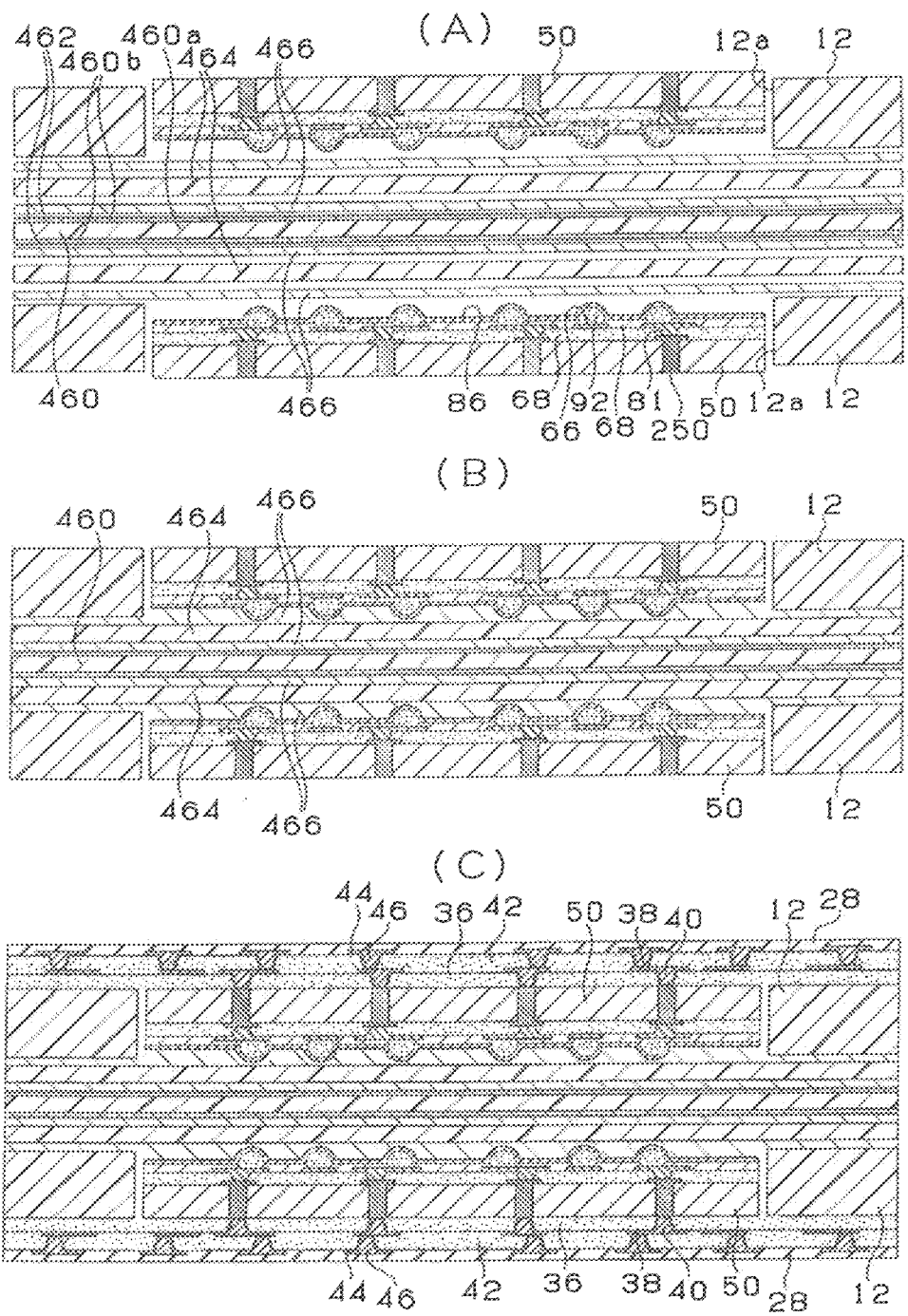
FIG. 23 are views showing the steps of a method for manufacturing a low-thermal-expansion substrate according to the fourth example of the present invention.
Figure 24:
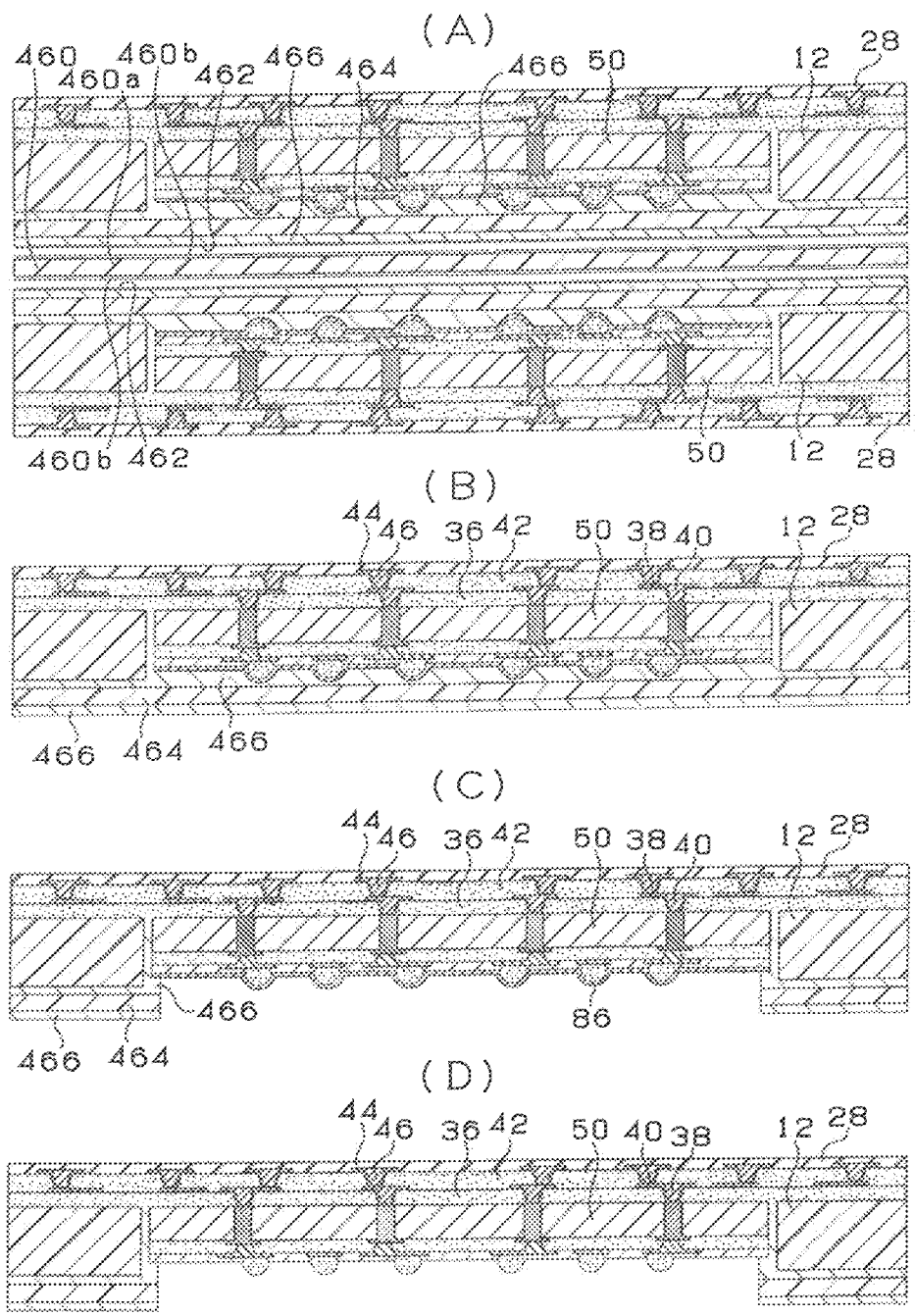
FIG. 24 are views showing the steps of a method for manufacturing a multilayer printed wiring board according to the fourth example.

A method for manufacturing multilayer printed wiring board 10 according to the fourth example is described with reference to FIGS. 23-24.

(1) Metal film 460 with a carrier is prepared (FIG. 23A). Such a metal film with a carrier is made up of carrier (support board) (460a) and metal film (460b) on the carrier; the metal film is laminated on both surfaces of the carrier. Removable layers 462 are formed on metal film (460b). As for the carrier, a substrate with reinforcing glass fabric or double-sided copper-clad laminate with a thickness of 40-800 μm may be used. As for the metal film, copper foil, nickel foil, aluminum foil or the like with a thickness of 3-50 μm may be used. As for removable layer 462, the following may be used: metal removable layers made of Ni, Cr or the like; or organic removable layers made of carboxybenzotriazole (CBTA), N',N'-bis (benzotriazole-methyl) urea (BTD-U), 3-amino-1H-1,2,4-triazole (ATA), or the like.

Meanwhile, copper-plated film 86 is formed on organic insulation layer 68 and solder bumps 92 in low-thermal-expansion substrate 50.

(2) Low-thermal-expansion substrate 50 accommodated in opening (12a) of core base material 12 is laminated on both surfaces of metal film 460 with a carrier, where core layer 464 and prepreg (466, 466) arranged on both surfaces of the core layer are placed between the substrate and the metal film (FIG. 23B).

(3) Next, the same as in the third example, lower interlayer resin insulation layers 36, via conductors 40, conductive circuits 38, upper interlayer resin insulation layers 42, via conductors 46 and conductive circuits 44, along with solder-resist layers 28, are formed on the surfaces of low-thermal-expansion substrates 50 arranged on the upper and lower sides (FIG. 23C).

(4) After that, using removable layers 462, metal film 460 with a carrier is separated from the laminates arranged on the upper and lower sides (FIG. 24A). The separated upper-side laminate is shown in FIG. 24B).

(5) Using a laser, core layer 464 and resin layers 466, which are the cured prepreg arranged on both surfaces of the core layer, are removed from the upper side of low-thermal-expansion substrate 50 to expose copper-plated film 86 on low-thermal-expansion substrate 50 (FIG. 24C).

(6) Copper-plated film 86 on low-thermal-expansion substrate 50 is removed by etching (FIG. 24D). Since the rest of the procedure is the same as in the third example, its description is omitted here. In the fourth example, productivity is approximately twice as that of the second example.

First Modified Example of the Fourth Example

Figure 25:
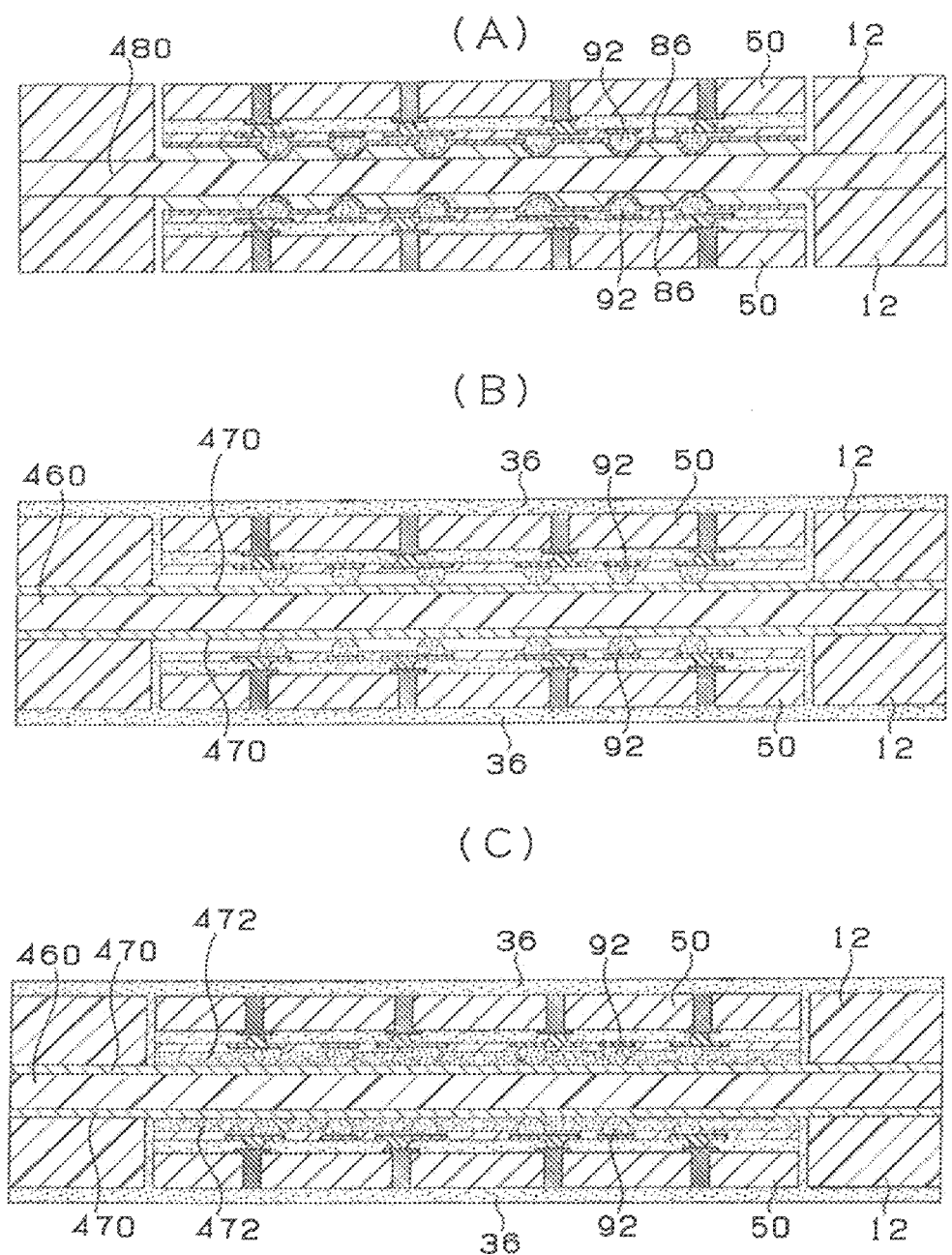
FIG. 25A is a view showing the steps of a method for manufacturing a multilayer printed wiring board according to the first modified example of the fourth example.
FIG. 25B is a view showing the steps of a method for manufacturing a multilayer printed wiring board according to the second modified example of the fourth example.
FIG. 25C is a view showing the steps of a method for manufacturing a multilayer printed wiring board according to the third modified example of the fourth example.

FIG. 25A shows a method for manufacturing a multilayer printed wiring board according to the first modified example of the fourth example. In the fourth example, metal film 460 with a carrier is used. In the first modified example, a multilayer printed wiring board is manufactured by laminating low-thermal-expansion substrates 50 and core base materials 12 on both surfaces of PET film 480 where adhesive film is formed.

Second Modified Example of the Fourth Example

FIG. 25B shows a method for manufacturing a multilayer printed wiring board according to the second modified example of the fourth example. In the fourth example, after low-thermal-expansion substrates 50 and core base materials 12 are laminated on metal film 460 with a carrier, interlayer resin insulation layers 36 are formed. By contrast, in the second modified example, after interlayer resin insulation layers 36 are formed on low-thermal-expansion substrates 50 and core base materials 12, low-thermal-expansion substrates 50 and core base materials 12 are laminated on metal film 460 with a carrier by means of removable material 470 made of thermoplastic resin. In the second modified example, protective copper-plated film is not required to be formed on low-thermal-expansion substrate 50.

Third Modified Example of the Fourth Example

FIG. 25C shows a method for manufacturing a multilayer printed wiring board according to the third modified example of the fourth example. In the third modified example, between removable material 470 of the second modified example and low-thermal-expansion substrate 50 and core base material 12, removable sheet 472 is further arranged.

Fifth Example

Figure 26:
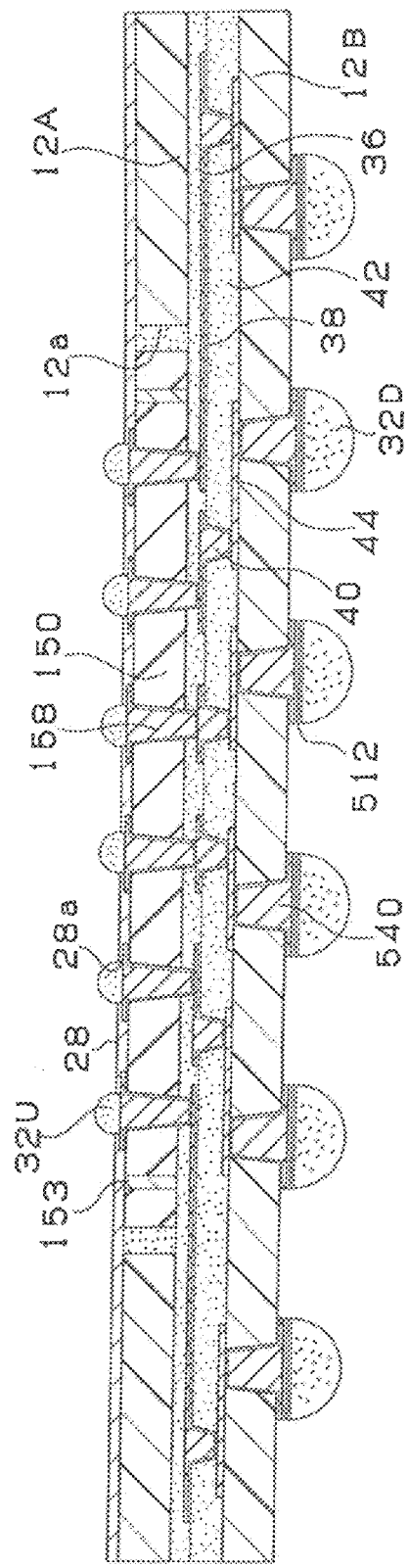
FIG. 26 is a cross-sectional view showing a multilayer printed wiring board according to the fifth example of the present invention.

A multilayer printed wiring board according to the fifth example is described. As shown in FIG. 26, a multilayer printed wiring board of the fifth example has two sheets of core substrate (12A, 12B), and between core substrates (12A, 12B), built-up layers are formed with interlayer insulation layer 42, via holes 40, conductive circuits 38 and interlayer insulation layer 36. Conductive circuits 44 are formed on the upper surface of core substrate (12B). Via holes 540 are formed inside core substrate (12B) to penetrate core substrate (12B). Solder bumps (32D) are formed on via holes 540 by means of Ni/Pb/Au layer 512. Opening (12a) is formed in core substrate (12A), and above-described low-thermal-expansion substrate 50 made of resin, silicon, ceramics or the like is accommodated in opening (12a). In low-thermal-expansion substrate 50, via holes 158 are formed to be connected to above-described via holes 40 and conductive circuits 38. Solder bumps (32U) are formed on the upper surfaces of via holes 158. Alignment marks 153 are formed in low-thermal-expansion substrate 50. Solder-resist layer 28 is formed on core substrate (12a) and low-thermal-expansion substrate 50. In the fifth example, warping in the entire wiring board may be suppressed by sandwiching the built-up layers with two highly rigid sheets of core substrate (12A, 12B).

Figure 27:
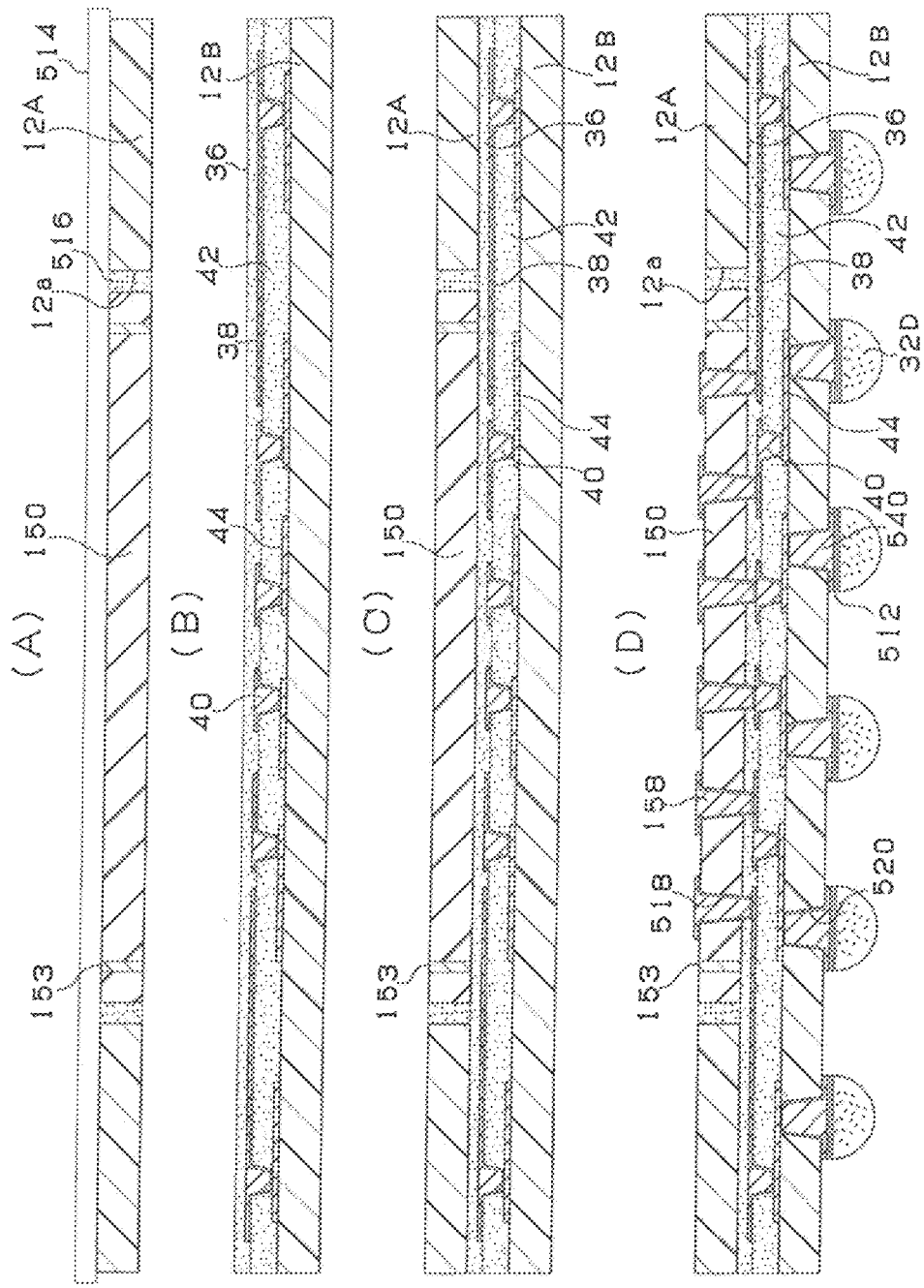
FIG. 27 are views showing the steps of a method for manufacturing a multilayer printed wiring board according to the fifth example.

A method for manufacturing multilayer printed wiring board 10 according to the fifth example is described with reference to FIG. 27.

(1) Low-thermal-expansion substrate 50 with alignment marks 153 is accommodated in opening (12a) in the center of core substrate (12A) reinforced with 40-800 μm-thick glass fabric and impregnated with resin (FIG. 27A). Here, core substrate (12A) and low-thermal-expansion substrate 50 are supported by PET film 514, and resin 516 is filled between opening (12a) and low-thermal-expansion substrate 50.

(2) Meanwhile, conductive circuits 44, interlayer insulation layer 42, via holes 40 and conductive circuits 38 are formed on core substrate (12B) reinforced with 40-800 μm-thick glass fabric and impregnated with resin. Then, adhesive layer 36 is formed on interlayer insulation layer 42 and conductive circuits 38 (FIG. 27B).

(3) Core substrate (12A) with accommodated low-thermal-expansion substrate 50 and core substrate (12B) with built-up layers are laminated, and the PET film is removed (FIG. 27C).

(4) Holes 518 are formed to penetrate low-thermal-expansion substrate 50 and interlayer insulation layer 36, and via holes 158 are formed. In the same manner, holes 520 are formed to penetrate core substrate (12B), and via holes 540 are formed (FIG. 27D). Solder bumps (32D) are formed on via holes 540 by means of Ni/Pb/Au layer 512.

(5) Solder-resist layer 28 is formed on low-thermal-expansion substrate 50 and core substrate (12A), and solder bumps (32U) are formed in openings (28a) of the solder-resist layer (FIG. 26).

A multilayer printed wiring board according to an embodiment of the present invention has a through-hole conductor that penetrates from the upper surface to the lower surface of the low-thermal-expansion substrate, a core base material that accommodates the low-thermal-expansion substrate in its opening, and built-up layers formed by laminating an interlayer resin insulation layer and a conductive layer on the low-thermal-expansion substrate and the core base material.

For example, by mounting a semiconductor element on a low-thermal-expansion substrate such as an Si (silicon) substrate, the difference in thermal expansion coefficients between the semiconductor element and the low-thermal-expansion substrate decreases. Accordingly, thermal stress exerted on solder bumps for mounting a semiconductor element is mitigated and an electrical disconnect in the solder bumps is suppressed. Therefore, connection reliability may be ensured. By forming wiring layers on a low-thermal-expansion substrate, electrode pitches in a semiconductor element may be gradually fanned out. However, if an interlayer resin insulation layer that forms a wiring layer expands/shrinks according to the thermal history of the semiconductor element, a printed wiring board may warp due to such expansion/shrinkage of the interlayer resin insulation layer. For that matter, since a printed wiring board according to the present invention has a core base material surrounding the low-thermal-expansion substrate, warping caused by the thermal history of the semiconductor element may be efficiently suppressed.

By accommodating a low-thermal-expansion substrate in an opening of a core base material, the thickness in the vertical direction may be reduced.

Also, by connecting a through-hole conductor of a low-thermal-expansion substrate and a conductive layer of a wiring layer with a copper-plated via conductor, for example, their connection reliability may be enhanced. Furthermore, since the present invention is different from an interposer such as disclosed in Japanese Laid-Open Patent Publication 2001-102479, the connection spots of solder bumps are fewer and the number of reflow procedures on the substrate decreases accordingly. Especially in recent years, since leadless solder, for example Sn-3Ag-0.5Cu, has been mainly used, the fusing temperature of such solder is becoming higher than that of tin-lead solder. Thus, the reflow temperature of such solder tends to be higher. Accordingly, the impact from reflow on wiring layers is becoming greater. Therefore, as in the present invention, by using via conductors when connecting a low-thermal-expansion substrate and a wiring board for accommodating the substrate, the number of reflow procedures may be reduced. As a result, wiring reliability may be improved.

If a wiring layer is formed on a core base material surrounding a low-thermal-expansion substrate, the wiring density of the core base material may be reduced by forming high-density wiring on the low-thermal-expansion substrate on which to mount an IC chip. Thus, the size of a low-thermal-expansion substrate where high-density wiring is required may be minimized. Furthermore, alignment accuracy when forming wiring on the core base material may be mitigated, allowing a rough wiring design of the wiring layer. Accordingly, the yield rates of wiring increase and productivity may improve.

The material for forming a core base material of a low-thermal-expansion substrate is preferred to be silicon. However, the material is not limited to such. For example, a ceramic substrate such as following may also be used: pyrex glass, zirconia, aluminum nitride, silicon nitride, silicon carbide, alumina, mullite, cordierite, steatite, forsterite or the like. Among those, an Si substrate is preferred in light of costs, since it is inexpensive and easy to obtain. Moreover, when using a low-thermal-expansion substrate made of resin with a thermal expansion coefficient of 2.5-10 ppm, it is easier to form penetrating holes using a laser.

Solder material to use in bonding portions between electronic components such as an IC and a multilayer printed wiring board is not limited to a specific kind, and the following may be used, for example: Sn/Pb, Sn/Ag, Sn/Ag/Cu, Sn, Sn/Cu, Sn/Sb, Sn/In/Ag, Sn/Bi or Sn/In.

In addition, by forming passive elements such as an inductor (L), capacitor (C), resistor (R), electrostatic discharge (ESD) or voltage regulator module (VRM) (DC-DC converter) on the core base material, on the low-thermal-expansion substrate or in a wiring layer, the power source may be reinforced and noise may be abated. Furthermore, by forming part of a redistribution layer (for example, a global wiring layer) of the IC chip in the low-thermal-expansion substrate, the yield rates of IC chips rise and manufacturing costs may be reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board comprising: a substrate comprising a core base material and having a penetrating portion; a low-thermal-expansion substrate comprising a low-thermal-expansion resin and accommodated inside the penetrating portion of the substrate, the low-thermal-expansion substrate having a first surface for mounting a semiconductor element and a second surface on the opposite side of the first surface; a first through-hole conductor provided inside the low-thermal-expansion substrate and configured to provide electrical connection between the first surface and the second surface of the low-thermal-expansion substrate; a filler filling a gap between the low-thermal-expansion substrate and an inner wall of the substrate; and a buildup layer formed on at least one of the first surface and the second surface of the low-thermal-expansion substrate and comprising a resin insulation layer and a conductive layer, wherein the buildup layer has a via conductor connecting the first through-hole conductor in the low-thermal-expansion substrate and the conductive layer in the buildup layer, the low-thermal-expansion resin of the low-thermal-expansion substrate has a thermal expansion coefficient in a range of 2.5 to 10 ppm, the buildup layer is formed on the first surface of the low-thermal-expansion substrate, and at least a portion of the buildup layer and at least a portion of the conductive layer are positioned inside the penetrating portion of the substrate to mount a semiconductor thereon, wherein the first through-hole conductor is tapered in a first direction, and the via conductor formed in the buildup layer is tapered in a second direction opposite to the first direction.

2. The multilayer printed wiring board according to claim 1, wherein the Young's modulus of the substrate is greater than the Young's modulus of the resin insulation layer that forms the buildup layer.

3. The multilayer printed wiring board according to claim 1, wherein the filler and the resin insulation layer are made of the same material.

4. The multilayer printed wiring board according to claim 1, wherein the thickness of the buildup layer formed on the first surface of the low-thermal-expansion substrate is less than the thickness of the low-thermal-expansion substrate.

5. The multilayer printed wiring board according to claim 1, wherein the low-thermal-expansion substrate has a corner portion which is tapered.

6. The multilayer printed wiring board according to claim 1, wherein the first through-hole conductor is formed in a plurality, and the buildup layer on the first surface of the low-thermal-expansion substrate has a plurality of mounting pads positioned to mount a semiconductor element and having a pitch which is narrower than a pitch of the plurality of first through-hole conductors.

7. The multilayer printed wiring board according to claim 1, wherein the first through-hole conductor is formed in a plurality, and the buildup layer on the first surface of the low-thermal-expansion substrate has a plurality of mounting pads positioned to mount a semiconductor element and having a pitch which is substantially the same as a pitch of the plurality of first through-hole conductors.

8. The multilayer printed wiring board according to claim 1, wherein the first through-hole conductor is formed in a plurality, the buildup layer is formed on the second surface of the low-thermal-expansion substrate, and the low-thermal-expansion substrate has a plurality of connection pads positioned to form electrical connection to other substrates and having a pitch which is greater than a pitch of the first through-hole conductors.

9. The multilayer printed wiring board according to claim 1, further comprising a resin layer formed on the first surface of the low-thermal-expansion substrate.

10. The multilayer printed wiring board according to claim 9, further comprising a conductive layer formed on the resin layer.

11. The multilayer printed wiring board according to claim 1, wherein the through-hole conductor formed in the low-thermal-expansion substrate is one of a power-source through-hole conductor and a ground through-hole conductor, and the through-hole conductor of the substrate is a signal through-hole conductor.

12. The multilayer printed wiring board according to claim 1, wherein the first through-hole conductor is extending through the resin insulation layer in the buildup layer.

13. The multilayer printed wiring board according to claim 1, further comprising a plurality of mounting pads positioned to mount a semiconductor element and formed on the first surface of the low-thermal-expansion substrate.

14. The multilayer printed wiring board according to claim 1, wherein the first through-hole conductor is extending through the buildup layer.

15. A multilayer printed wiring board comprising: a substrate comprising a core base material and having a penetrating portion; a low-thermal-expansion substrate comprising a low-thermal-expansion resin and accommodated inside the penetrating portion of the substrate, the low-thermal-expansion substrate having a first surface and a second surface on an opposite side of the first surface, the first surface of the low-thermal-expansion substrate having a semiconductor-mounting surface; a filler filling a gap between the low-thermal-expansion substrate and an inner wall of the substrate; a first buildup layer formed on the first surface of the low-thermal-expansion substrate and comprising a first insulation layer and a first conductive layer; a second buildup layer formed on a first surface of the substrate and on the first surface of the low-thermal-expansion substrate and having an opening exposing the semiconductor-mounting surface of the low-thermal-expansion substrate and at least a portion of the first build-up layer; and a through-hole conductor formed inside the substrate and configured to provide electrical connection between the first surface of the substrate and a second surface of the substrate on an opposite side of the first surface of the substrate, wherein the second buildup layer comprises a second insulation layer and a second conductive layer laminated to the second insulation layer and has a via conductor connecting the second conductive layer in the second buildup layer and the first conductive layer in the first buildup layer, further comprising a through-hole conductor formed inside the low-thermal-expansion substrate and configured to provide electrical connection between the first surface and the second-surface of the low-thermal-expansion substrate, wherein the first buildup layer has a via conductor connecting the through-hole conductor in the low-thermal-expansion substrate and the first conductive layer in the first buildup layer, the through-hole conductor formed inside the low-thermal-expansion substrate is tapered in a first direction, and the via conductor formed in the first buildup layer is tapered in a second direction opposite to the first direction.

16. The multilayer printed wiring board according to claim 15, further comprising a through-hole conductor formed inside the low-thermal-expansion substrate and configured to provide electrical connection between the first surface and the second-surface of the low-thermal-expansion substrate, wherein the through-hole conductor in the low-thermal-expansion substrate is extending through the resin insulation layer in the buildup layer.

17. The multilayer printed wiring board according to claim 15, further comprising a plurality of mounting pads positioned to mount a semiconductor element and formed on the first surface of the low-thermal-expansion substrate.

18. The multilayer printed wiring board according to claim 15, wherein the low-thermal-expansion resin of the low-thermal-expansion substrate has a thermal expansion coefficient in a range of 2.5 to 10 ppm.

* * * * *